(12) United States Patent
Gluschenkov et al.

(10) Patent No.: US 9,917,060 B1
(45) Date of Patent: Mar. 13, 2018

(54) FORMING A CONTACT FOR A SEMICONDUCTOR DEVICE

(71) Applicant: INTERNATIONAL BUSINESS MACHINES CORPORATION, Armonk, NY (US)

(72) Inventors: Oleg Gluschenkov, Tannersville, NY (US); Zuoguang Liu, Schenectady, NY (US); Shogo Mochizuki, Clifton Park, NY (US); Hiroaki Niimi, Cohoes, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/331,331

(22) Filed: Oct. 21, 2016

(51) Int. Cl.
| | |
|---|---|
| *H01L 21/02* | (2006.01) |
| *H01L 23/535* | (2006.01) |
| *H01L 29/08* | (2006.01) |
| *H01L 29/161* | (2006.01) |
| *H01L 29/165* | (2006.01) |
| *H01L 29/24* | (2006.01) |
| *H01L 29/267* | (2006.01) |
| *H01L 29/78* | (2006.01) |
| *H01L 23/532* | (2006.01) |
| *H01L 21/768* | (2006.01) |

(Continued)

(52) U.S. Cl.
CPC ...... *H01L 23/535* (2013.01); *H01L 21/76805* (2013.01); *H01L 21/76846* (2013.01); *H01L 21/76895* (2013.01); *H01L 21/823814* (2013.01); *H01L 21/823821* (2013.01); *H01L 21/823871* (2013.01); *H01L 23/53266* (2013.01); *H01L 27/0924* (2013.01); *H01L 29/0847* (2013.01); *H01L 29/161* (2013.01); *H01L 29/165* (2013.01); *H01L 29/24* (2013.01); *H01L 29/267* (2013.01); *H01L 29/7848* (2013.01); *H01L 29/7851* (2013.01)

(58) Field of Classification Search
None
See application file for complete search history.

(56) References Cited

U.S. PATENT DOCUMENTS

| | | |
|---|---|---|
| 4,204,028 A | 5/1980 | Donley |
| 5,017,446 A | 5/1991 | Reichman et al. |

(Continued)

OTHER PUBLICATIONS

Kim et al., "Non-Alloyed Ohmic Contacts on GaAs Using Metal-Interlayer-Semiconductor Structure With SF 6 Plasma Treatment", IEEE Electron Device Letters, 2016, pp. 373-376, vol. 37, No. 4.

(Continued)

*Primary Examiner* — Cuong Q Nguyen
*Assistant Examiner* — Nishath Yasmeen
(74) *Attorney, Agent, or Firm* — Cantor Colburn LLP; Vazken Alexanian

(57) ABSTRACT

A method for fabricating a semiconductor device includes forming a gate stack on a semiconductor substrate, forming a source/drain region on an exposed portion of the substrate, and forming a semiconductor material layer on the source/drain region. A first liner layer is deposited on the semiconductor material layer, and a second liner layer is deposited on the first liner layer. A conductive contact material is deposited on the second liner layer.

19 Claims, 34 Drawing Sheets

(51) Int. Cl.
*H01L 27/092* (2006.01)
*H01L 21/8238* (2006.01)

(56) References Cited

U.S. PATENT DOCUMENTS

| | | | | |
|---|---|---|---|---|
| 6,075,291 A * | 6/2000 | Thakur | ............. | H01L 21/28525 257/616 |
| 7,566,605 B2 | 7/2009 | Shifren et al. | | |
| 9,293,462 B2 | 3/2016 | Koh et al. | | |
| 2007/0057325 A1* | 3/2007 | Hsu | .................. | H01L 29/66795 257/347 |
| 2010/0155846 A1* | 6/2010 | Mukherjee | ........ | H01L 21/28512 257/365 |
| 2012/0153387 A1 | 6/2012 | Murthy et al. | | |
| 2013/0240989 A1 | 9/2013 | Glass et al. | | |
| 2013/0248999 A1 | 9/2013 | Glass et al. | | |
| 2014/0264494 A1* | 9/2014 | Xu | .................. | H01L 29/41725 257/288 |
| 2014/0322882 A1* | 10/2014 | Rodder | ............. | H01L 29/66795 438/289 |
| 2015/0069473 A1 | 3/2015 | Glass et al. | | |
| 2015/0279840 A1 | 10/2015 | Huang et al. | | |
| 2015/0311320 A1* | 10/2015 | Cheng | ............... | H01L 29/66795 438/157 |

OTHER PUBLICATIONS

Kim et al., "The efficacy of metal-interfacial layer-semiconductor source/drain structure on sub-10-nm n-type Ge FinFET performances", IEEE Electron Device Letters, 2014, 1185-1187, vol. 35, No. 12.

Kim et al..Fermi-Level Unpinning Using a Ge-Passivated Metal-Interlayer-Semiconductor Structure for Non-Alloyed Ohmic Contact of High-Electron-Mobility Transistors, IEEE Electron Device Letters, vol. 36, No. 9, Sep. 2015, pp. 884-886.

Liao et al., "The comprehensive study and the reduction of contact resistivity on the n-InGaAs MIS contact system with different inserted insulators", AIP Advances, 5(5), 2015, pp. 057117-057117-4.

Lin, "Low Resistance Contacts to N-Type Germanium", PhD Thesis, Stanford University, Stanford CA, Jun. 2013, pp. 1-136.

Paramahans et al., "ZnO: an attractive option for n-type metal-interfacial layer-semiconductor (Si, Ge, SiC) contacts", In VLSI Technology Symp. (VLSIT), 2012, pp. 83-84.

List of IBM Patents or Patent Applications Treated As Related; (Appendix P), filed Sep. 6, 2017; pp. 1-2.

Oleg Gluschenkov et al., "Forming a Contact for a Semiconductor Device," Related Application, U.S. Appl. No. 15/474,147, filed Mar. 30, 2017.

* cited by examiner

FORMING A CONTACT FOR A SEMICONDUCTOR DEVICE

BACKGROUND

The present invention generally relates to complimentary metal-oxide semiconductors (CMOS) and metal-oxide-semiconductor field-effect transistors (MOSFET), and more specifically, to contact formation during finFET device fabrication.

The MOSFET is a transistor used for switching electronic signals. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

SUMMARY

According to an embodiment of the present invention, a method for fabricating a semiconductor device includes forming a gate stack on a semiconductor substrate, forming a source/drain region on an exposed portion of the substrate, and forming a semiconductor material layer on the source/drain region. A first liner layer is deposited on the semiconductor material layer, and a second liner layer is deposited on the first liner layer. A conductive contact material is deposited on the second liner layer.

According to another embodiment of the present invention, a method for fabricating a semiconductor device includes forming a gate stack on a semiconductor substrate, forming a source/drain region on an exposed portion of the substrate, the source/drain region including a first dopant, and forming a semiconductor material layer on the source/drain region. A liner layer is deposited including a conductive metallic oxide material on the semiconductor material layer. A second liner is deposited including a metallic material on the first liner layer. A conductive contact material is deposited on the second liner layer.

According to yet another embodiment of the present invention, a method for fabricating a semiconductor device includes forming a gate stack on a semiconductor substrate, forming a first source/drain region and a second source/drain region on exposed portions of the substrate, and forming a semiconductor material layer on the first source/drain region and the second source/drain region. A first liner layer is deposited on the semiconductor material layer over the first source/drain region and the second source/drain region. A portion of the first liner layer is removed from over the second source/drain region. A portion of the semiconductor material layer is removed to expose the second source/drain region. A second liner layer is deposited on the first liner layer and the exposed second source/drain region. A conductive contact material is deposited on the second liner layer.

According to yet another embodiment of the present invention, a semiconductor device includes a gate stack arranged over a channel region of a semiconductor substrate, a spacer arranged adjacent to the gate stack, and a first source/drain region arranged adjacent to the spacer. The first source/drain region includes a first doped crystalline semiconductor material arranged on the substrate, a second doped crystalline semiconductor material arranged on the first doped crystalline semiconductor material, a first liner layer comprising a metallic oxide layer arranged on the second doped crystalline semiconductor material, and a second liner layer comprising a metallic material arranged on the first liner layer. A second source/drain region is arranged adjacent to the spacer, the second source/drain region includes a third doped crystalline semiconductor material arranged on the substrate, and the second liner layer comprising the metallic material arranged on the third doped crystalline semiconductor material. A conductive contact material is arranged on the first source/drain region and the second source/drain region.

BRIEF DESCRIPTION OF THE DRAWINGS

FIGS. 1-17B illustrate an exemplary method for forming a FET device having reduced external resistance.

FIG. 1 illustrates a side view of a wafer that includes a semiconductor layer (substrate) and a sacrificial hardmask arranged on the semiconductor substrate.

FIG. 3 illustrates a cut-away view following the formation of a shallow trench isolation (STI) region adjacent to the fins.

FIG. 6 illustrates a top view of the resultant structure following the removal of the sacrificial gates (of FIG. 5B) to form cavities that expose the channel regions of the fins.

FIG. 7 illustrates a top view of the resultant structure following the formation of a replacement metal gate stack (gate stack).

FIGS. 17A and 17B illustrate cut-away views following a planarization process that removes overburdened materials and forms conductive contacts of a pFET device and an nFET device.

DETAILED DESCRIPTION

Figure 1:
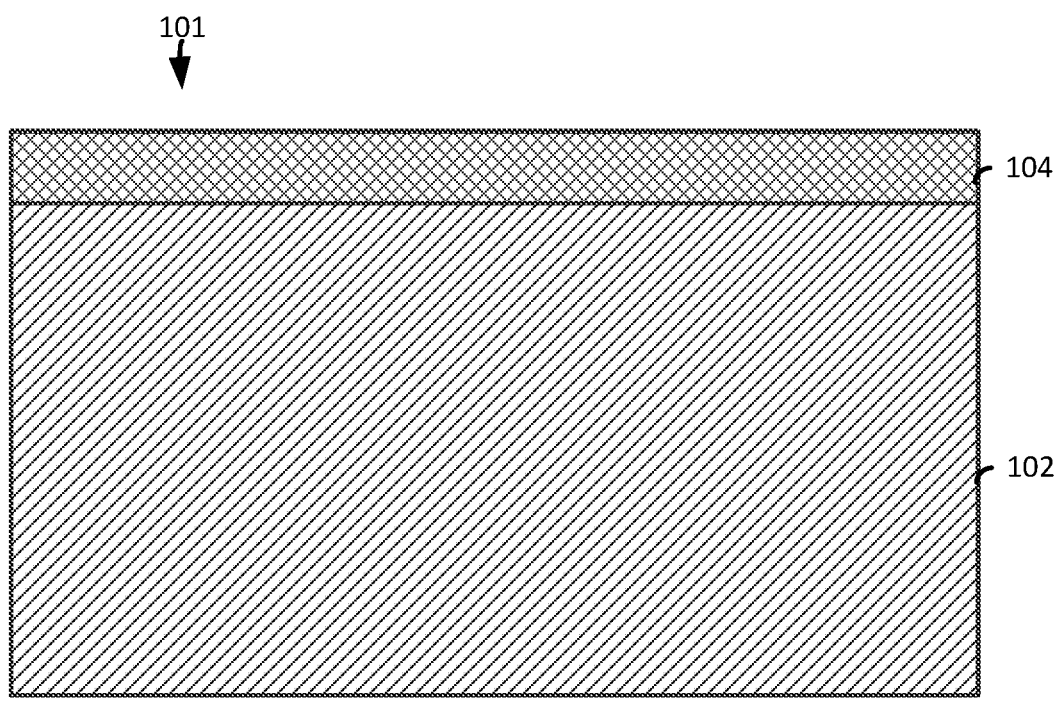

As previously noted herein, the MOSFET is a transistor used for switching electronic signals. The MOSFET has a source, a drain and a gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

Gate spacers form an insulating film along the gate sidewalls. Gate spacers can also initially be formed along sacrificial gate sidewalls in replacement gate technology. The gate spacers are used to define source/drain regions in active areas of a semiconductor substrate located adjacent to the gate.

The source/drain regions are often formed with a silicide material that is formed on a doped semiconductor material. A liner layer is often arranged on the silicide material, and a conductive contact is formed on the liner layer.

Device scaling in the semiconductor industry reduces costs, decreases power consumption and provides faster devices with increased functions per unit area. Improvements in optical lithography have played a major role in device scaling. However, optical lithography has limitations for minimum dimensions and pitch, which are determined by the wavelength of the irradiation.

In finFET devices, a conductive contact is formed over the source/drain regions to connect the finFET device to a circuit. The conductive contact is often formed by forming a trench in an insulator layer to expose the source/drain region.

In previous finFET devices, a source/drain region is formed by epitaxially growing a SiGe material on the exposed fins. A trench Ge material can be formed over the SiGe material that provides a unipolar heterojunction interface between the SiGe material and the Ge material. The resultant structure causes undesirable external resistance in the device.

The illustrated exemplary methods and embodiments described herein provide for the formation of a contact over the source/drain regions of a CMOS device. The pFET portion of the device includes a contact that includes doped germanium (e.g., Ge:B) that is further doped with a Ga or Al ion implantation, which reduces contact resistance in the pFET source/drain region.

FIGS. 1-15 illustrate an exemplary method for forming a FET device having reduced external resistance.

FIG. 1 illustrates a side view of a wafer 101 that includes a semiconductor layer (substrate) 102 and a sacrificial hardmask 104 arranged on the semiconductor substrate 102. In an alternate exemplary embodiment, a semiconductor on insulator substrate can be used.

Non-limiting examples of suitable materials for the semiconductor layer 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

A hardmask 104 is arranged on the semiconductor substrate 102. The hardmask 104 can include, for example, silicon oxide, silicon nitride (SiN), SiOCN, SiBCN or any suitable combination of those. The hardmask 104 can be deposited using a deposition process, including, but not limited to, PVD, CVD, PECVD, or any combination thereof.

Though the illustrated embodiments show a bulk semiconductor substrate 102, alternative exemplary embodiments can include a semiconductor on insulator wafer arrangement.

Figure 2A:
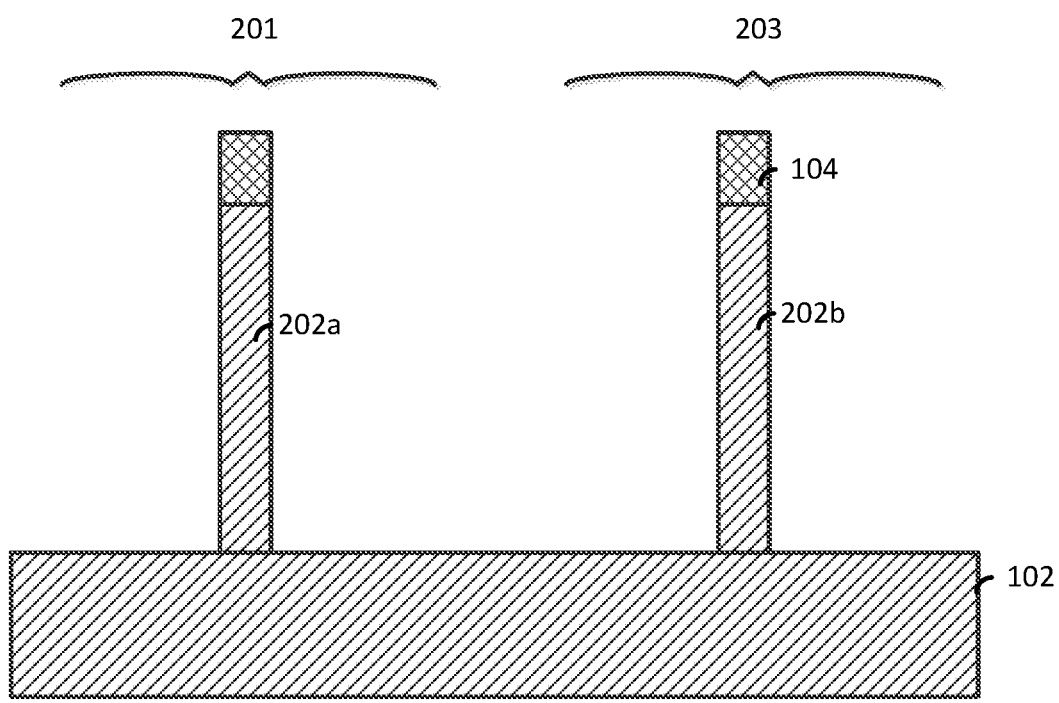
FIG. 2A illustrates a cut-away view along the line A-A (of FIG. 2B) following a lithographic patterning and etching process that forms semiconductor fins.

FIG. 2A illustrates a cut-away view along the line A-A (of FIG. 2B) following a lithographic patterning and etching process that forms semiconductor fins 202a and 202b. The fins 202a and 202b are formed by, for example, a photolithographic patterning and etching process such as reactive ion etching process that patterns a resist on the hardmask 104 and removes exposed portions of the hardmask 104 and the substrate 102 to form the fins 202a and 202b. In the illustrated exemplary embodiment the fins 201 will form a pFET device and the fins 203 will form an nFET device.

Figure 2B:
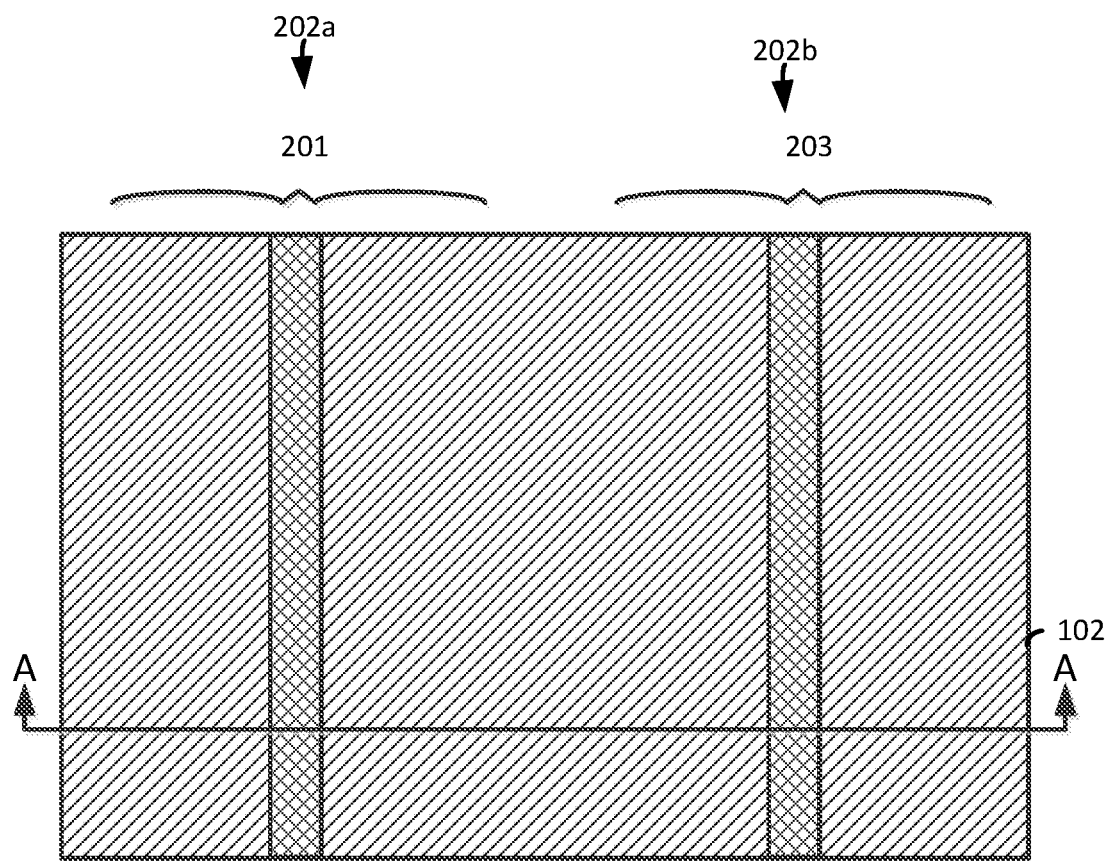
FIG. 2B illustrates a top view of the fins arranged on the substrate.

FIG. 2B illustrates a top view of the fins 202a and 202b arranged on the substrate 102.

Figure 3:
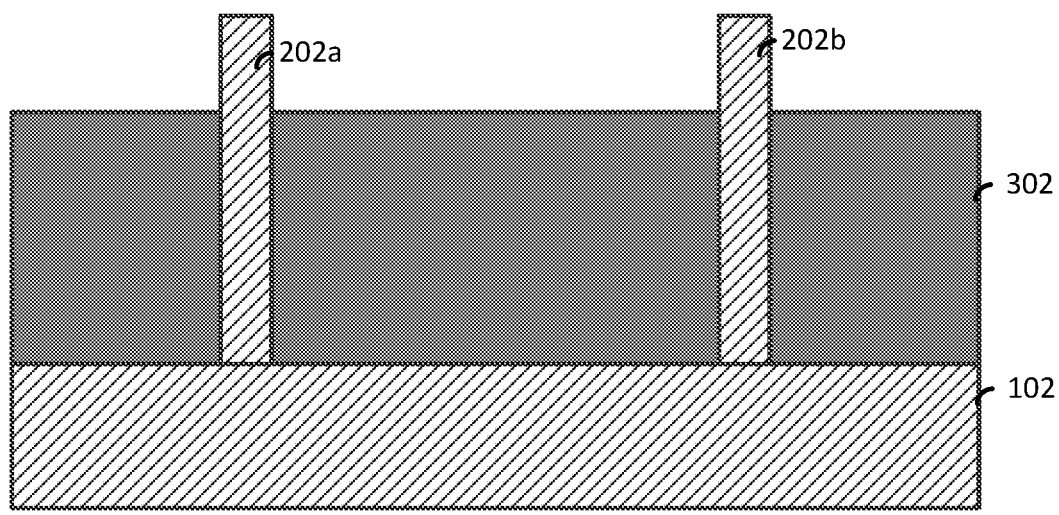

FIG. 3 illustrates a cut-away view following the formation of a shallow trench isolation (STI) region 302 adjacent to the fins 202a and 202b. The STI region 302 can be formed by, any suitable process including, for example, lithography or etching to form trenches, and then filling the trenches with an insulating material, such as silicon dioxide.

In the illustrated embodiment, at least one isolation region is a shallow trench isolation region ("STI"). However, the isolation region 302 can be a trench isolation region, a field oxide isolation region (not shown), or any other type of isolation region. The isolation region 302 provides isolation between neighboring gate structure regions, and can be used when the neighboring gates have opposite conductivities, e.g., nFETs and pFETs. As such, the isolation region 302 separates an nFET device region from a pFET device region.

Figure 4A:
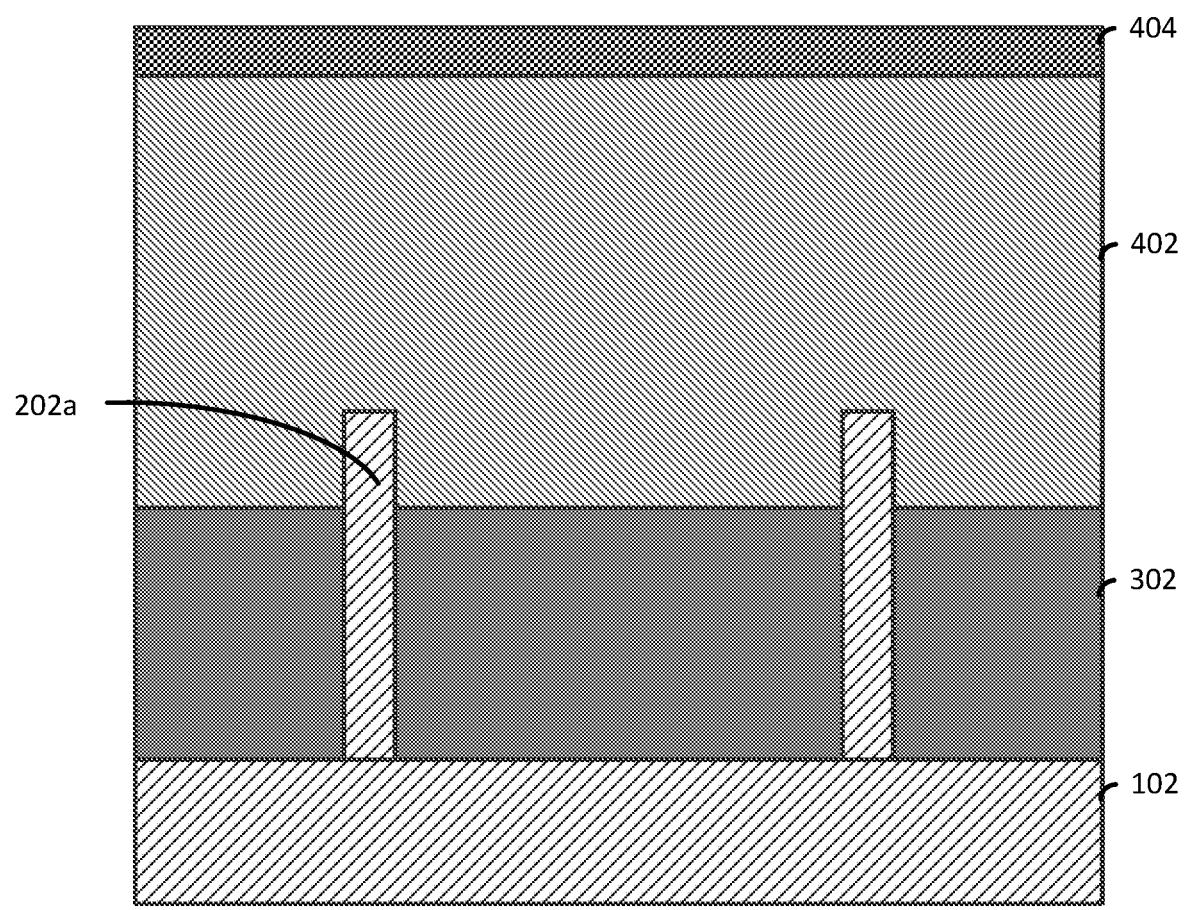
FIG. 4A illustrates a cut-away view along the line A-A (of FIG. 4B) following the formation of sacrificial gate over channel regions of the fins.

FIG. 4A illustrates a cut-away view along the line A-A (of FIG. 4B) following the formation of sacrificial gate 402 over channel regions of the fins 202a and 202b and spacers 406.

The sacrificial gate 402 in the exemplary embodiment is formed by depositing a layer (not shown) of sacrificial gate material such as, for example, amorphous silicon (aSi), or polycrystalline silicon (polysilicon) material or another suitable sacrificial gate material. The sacrificial gate 402 can further include a sacrificial gate dielectric material such as silicon oxide between the nanowires and aSi or polysilicon material.

The layer of sacrificial gate material can be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 404. The hardmask layer can be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gate 402 and the sacrificial gate cap 404.

Spacers 406 are formed adjacent to the sacrificial gates 402. The spacers 406 in the illustrated embodiment are formed by depositing a layer of spacer material (not shown) over the exposed portions of the fins 202a and 202b and the sacrificial gates 402.

Non-limiting examples of suitable materials for the layer of spacer material include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Figure 4B:
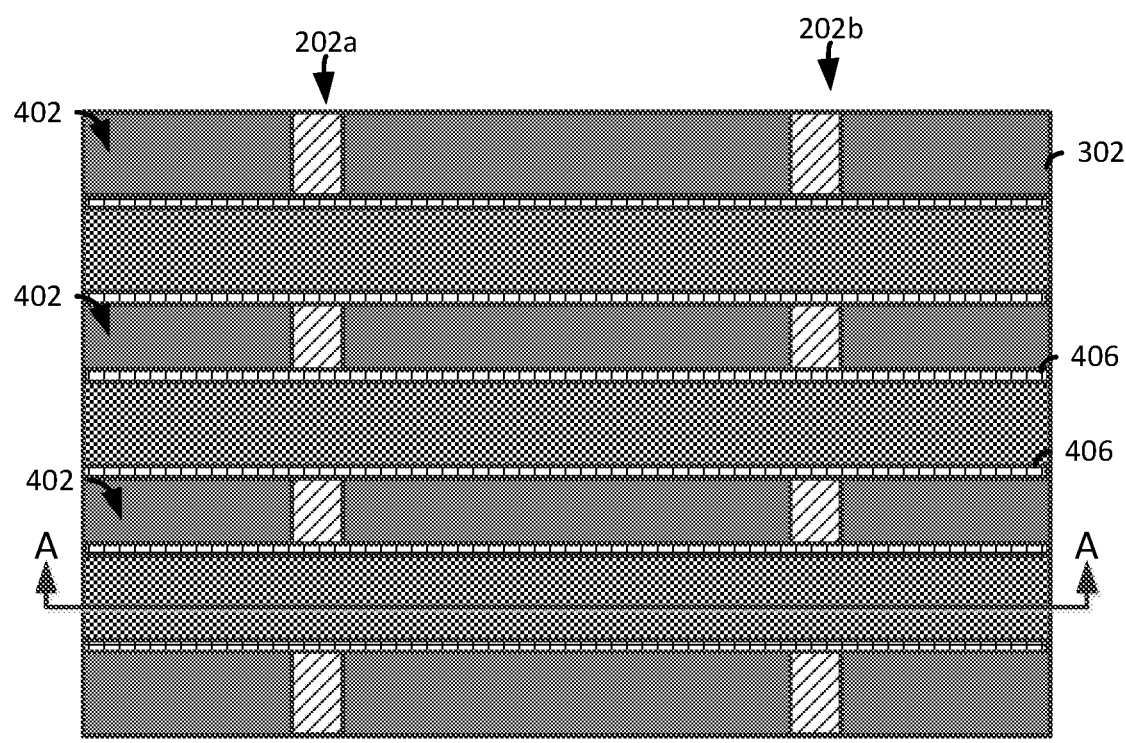
FIG. 4B illustrates a top view of the sacrificial gate.

Following the deposition of the layer of spacer material, a suitable anisotropic etching process such as, for example, a reactive ion etching process is performed to remove portions of the layer of spacer material and form the spacers 406. FIG. 4B illustrates a top view of the sacrificial gate 402 and spacers 406.

Figure 5A:
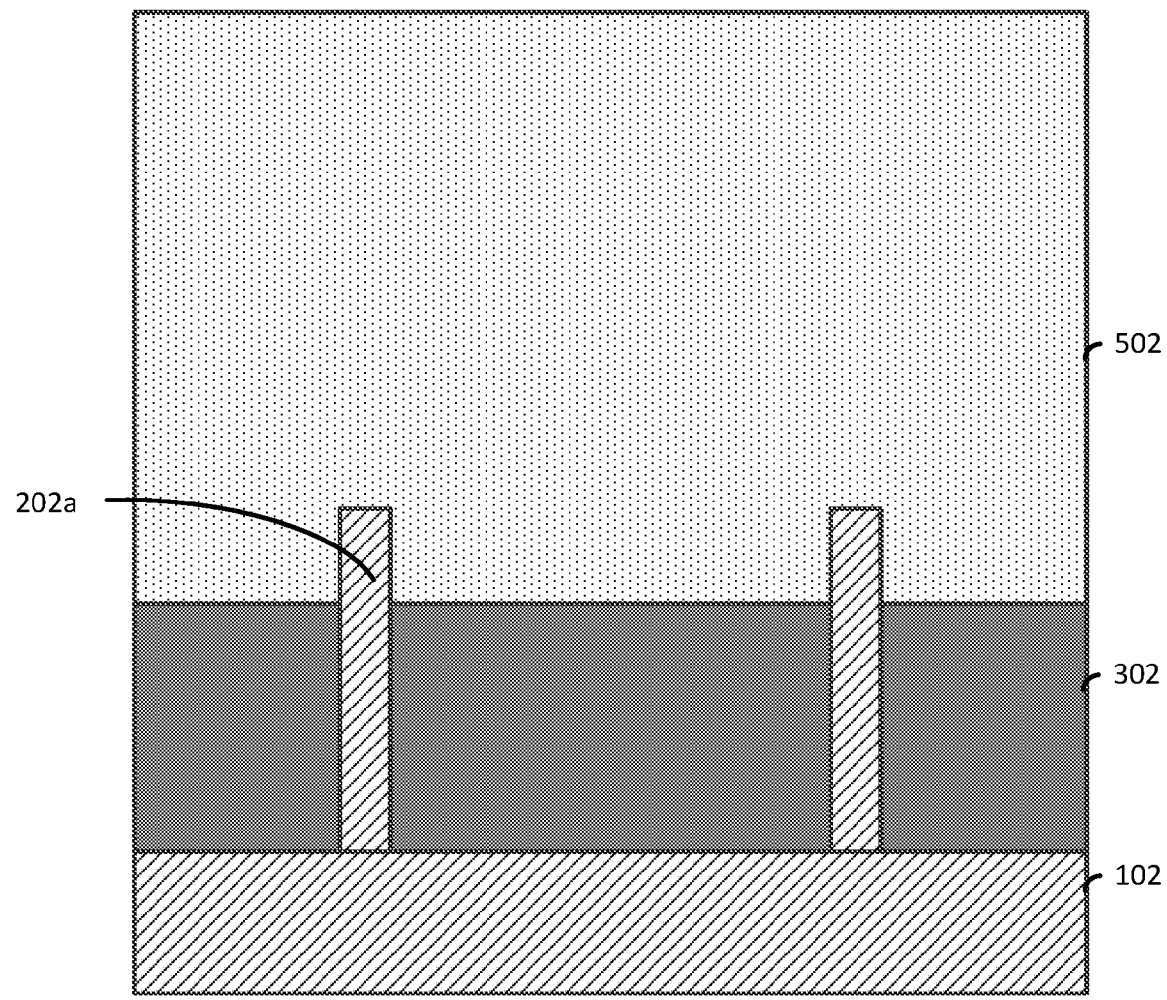
FIG. 5A illustrates a cut-away view along the line A-A (of FIG. 5B) following the formation of an inter-level dielectric layer over the fins.

FIG. 5A illustrates a cut-away view along the line A-A (of FIG. 5B) following the formation of an inter-level dielectric layer 502 over the fins 202a and 202b.

The inter-level dielectric layer 502 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 502 is deposited by a deposition process, including, but not limited to CVD, PVD, plasma enhanced CVD, atomic layer deposition (ALD), evaporation, chemical solution deposition, or like processes. Following the deposition of the inter-level dielectric layer 502, a planarization process such as, for example, chemical mechanical polishing is performed.

Figure 5B:
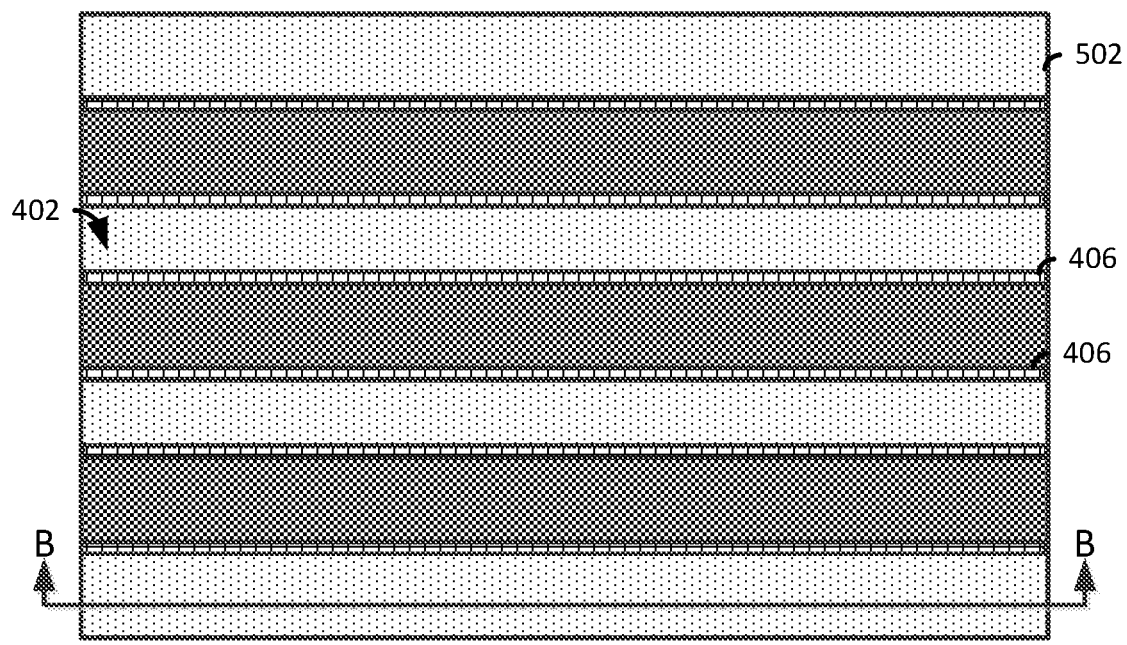
FIG. 5B illustrates a top view of the inter-level dielectric layer and the spacers arranged adjacent to the sacrificial gate.

FIG. 5B illustrates a top view of the inter-level dielectric layer 502 and the spacers 406 arranged adjacent to the sacrificial gate 402.

Figure 6:
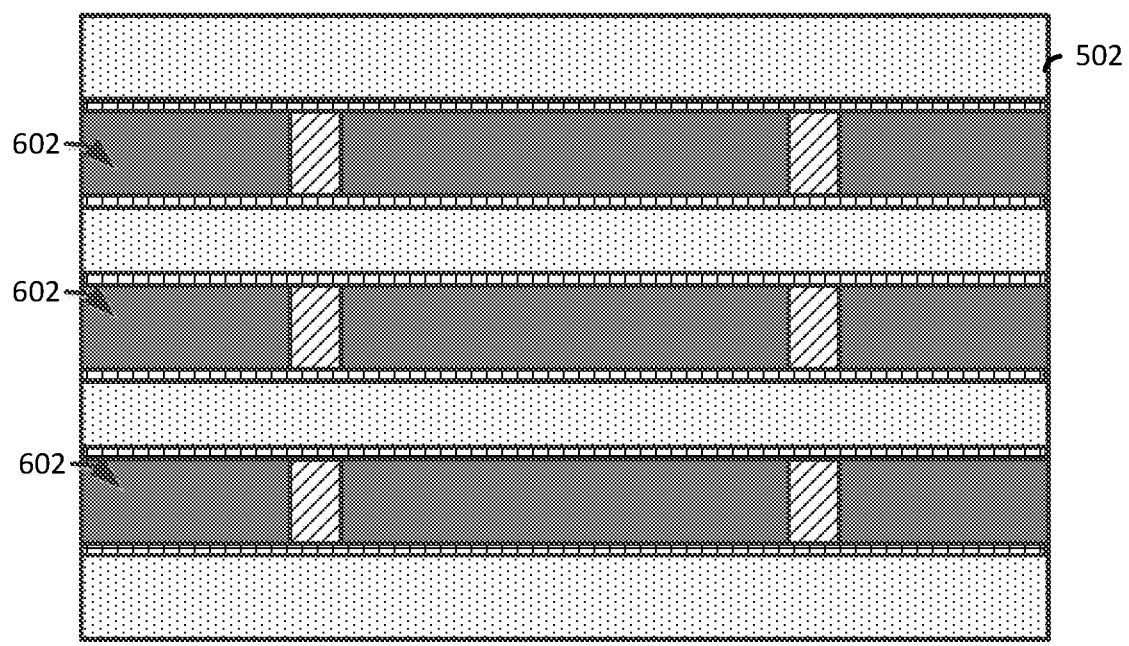

FIG. 6 illustrates a top view of the resultant structure following the removal of the sacrificial gates 402 (of FIG. 5B) to form cavities 602 that expose the channel regions of the fins 202a and 202b. The sacrificial gates 402 can be removed by performing a dry etch process, for example, RIE, followed by a wet etch process. The wet etch process is selective to (will not substantially etch) the spacers 406 and the inter-level dielectric material. The chemical etch process can include, but is not limited to, hot ammonia or tetramethylammonium hydroxide (TMAH).

Figure 7:
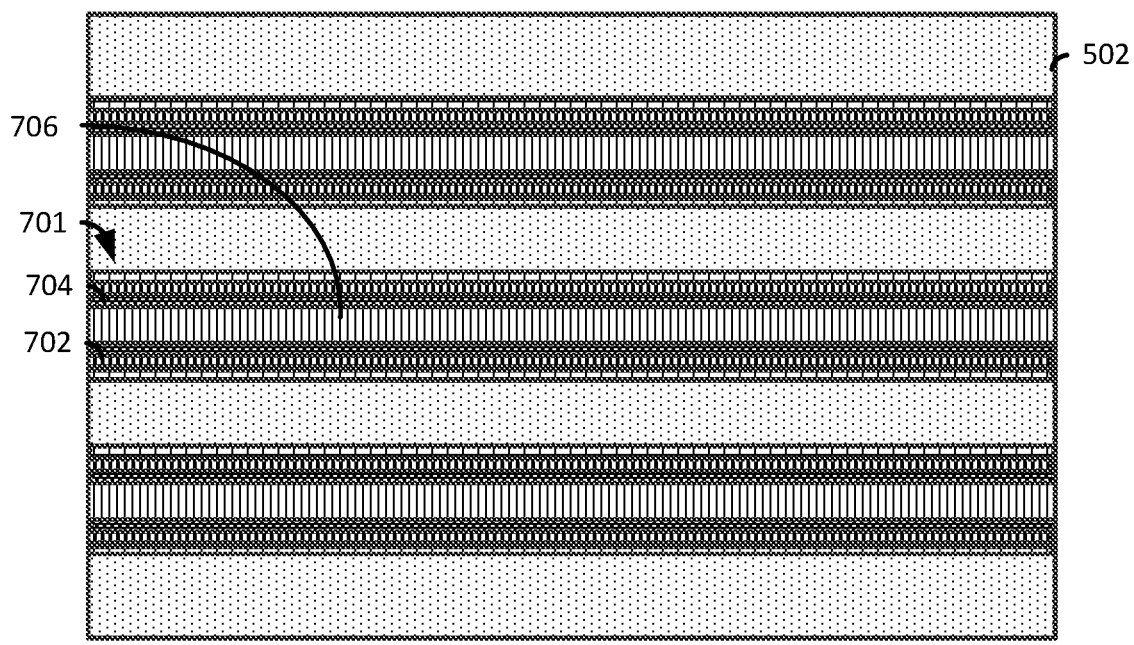

FIG. 7 illustrates a top view of the resultant structure following the formation of a replacement metal gate stack (gate stack) 701. The gate stack 701 include high-k metal gates formed, for example, by filling the cavity 602 (of FIG. 6) with one or more gate dielectric 702 materials, one or more workfunction metals 704, and one or more metal gate conductor 706 materials. The gate dielectric 702 material(s) can be a dielectric material having a dielectric constant greater than 3.9, 7.0, or 10.0. Non-limiting examples of suitable materials for the dielectric 702 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric 702 materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 704 can be disposed over the gate dielectric 702 material. The type of work function metal(s) 704 depends on the type of transistor and can differ between the nFET and pFET devices. Non-limiting examples of suitable work function metals 704 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The gate conductor 706 material(s) is deposited over the gate dielectric 702 materials and work function metal(s) 704 to form the gate stack 701. Non-limiting examples of suitable conductive metals include aluminum (Al), platinum (Pt), gold (Au), tungsten (W), titanium (Ti), or any combination thereof. The gate conductor 706 material(s) can be deposited by a suitable deposition process, for example, CVD, PECVD, PVD, plating, thermal or e-beam evaporation, and sputtering.

Following the deposition of the gate dielectric 702 materials, the work function metal(s) 704, and the gate conductor 706 material(s), planarization process, for example, chemical mechanical planarization (CMP), is performed to remove the overburden of the deposited gate materials and form the gate stack 701

Figure 8A:
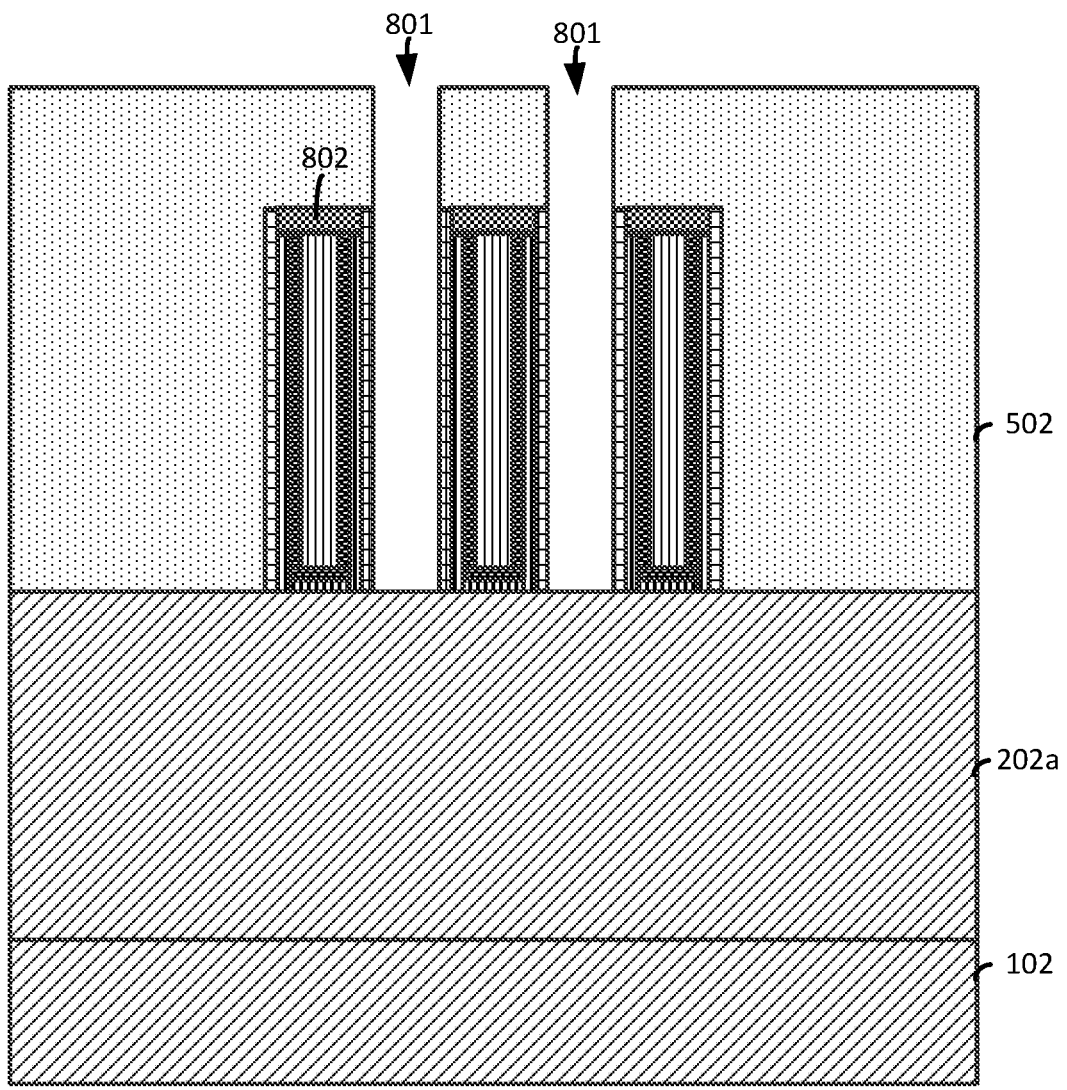
FIG. 8A illustrates a cut-away view along the line C-C (of FIG. 8C) following the removal of portions of the inter-level dielectric layer to form trenches adjacent to the spacers that expose portions of the fin and the shallow trench isolation region.
Figure 8B:
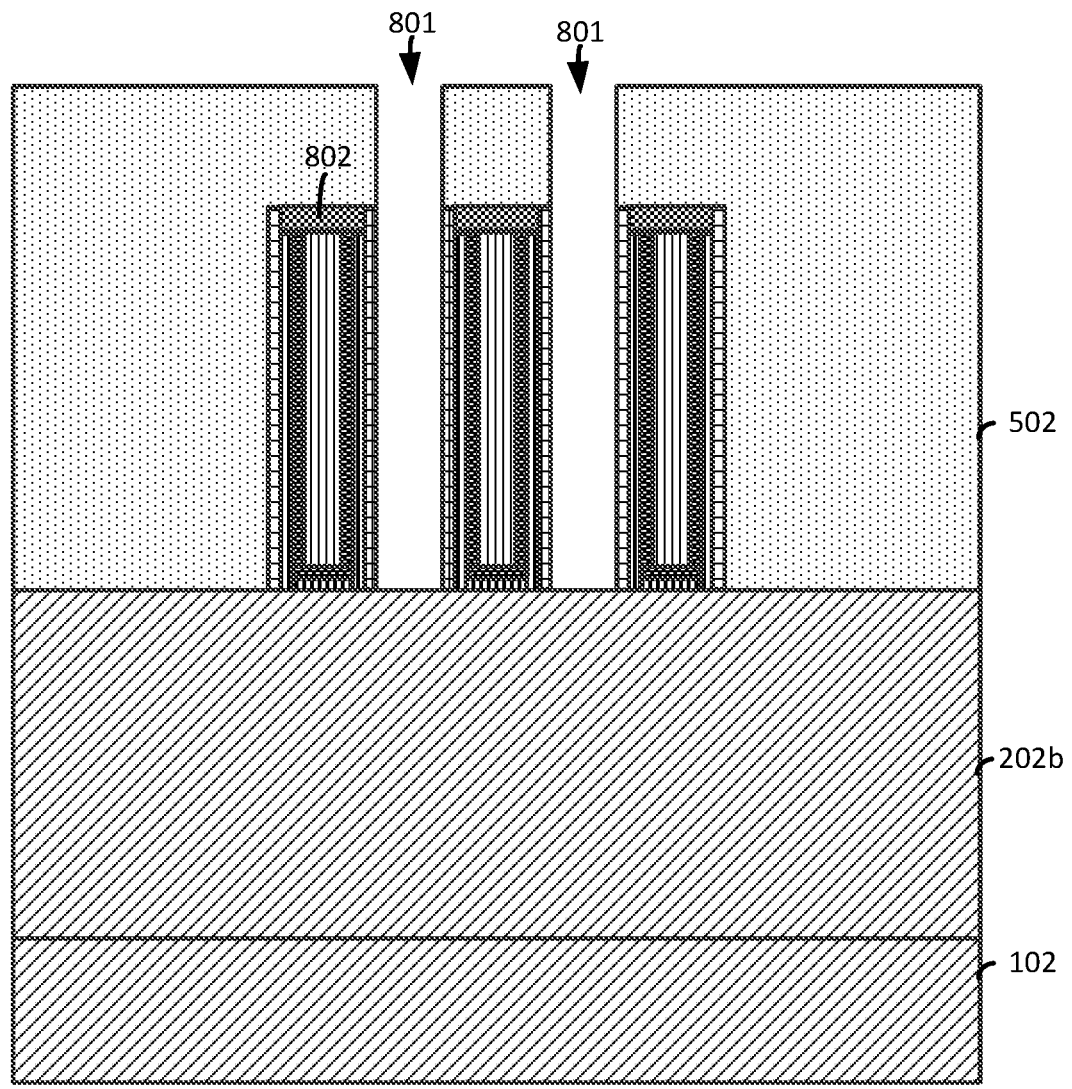
FIG. 8B illustrates a cut-away view along the line D-D (of FIG. 8C).
Figure 8C:
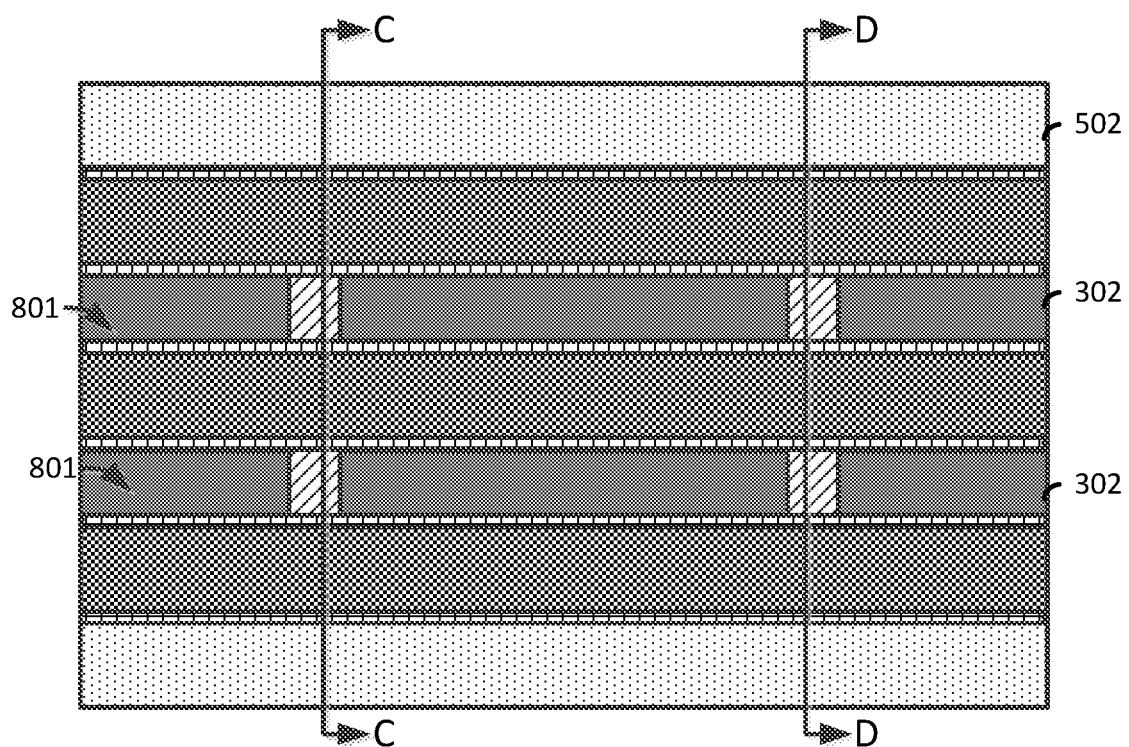
FIG. 8C illustrates a top view of the trenches.

FIG. 8A illustrates a cut-away view along the line C-C (of FIG. 8B) following the removal of portions of the inter-level dielectric layer 502 to form trenches 801 adjacent to the spacers 502 that expose portions of the fins 202a and 202b and the shallow trench isolation region 302. FIG. 8B illustrates a cut-away view along the line D-D (of FIG. 8C). FIG. 8C illustrates a top view of the trenches 801.

Figure 9A:
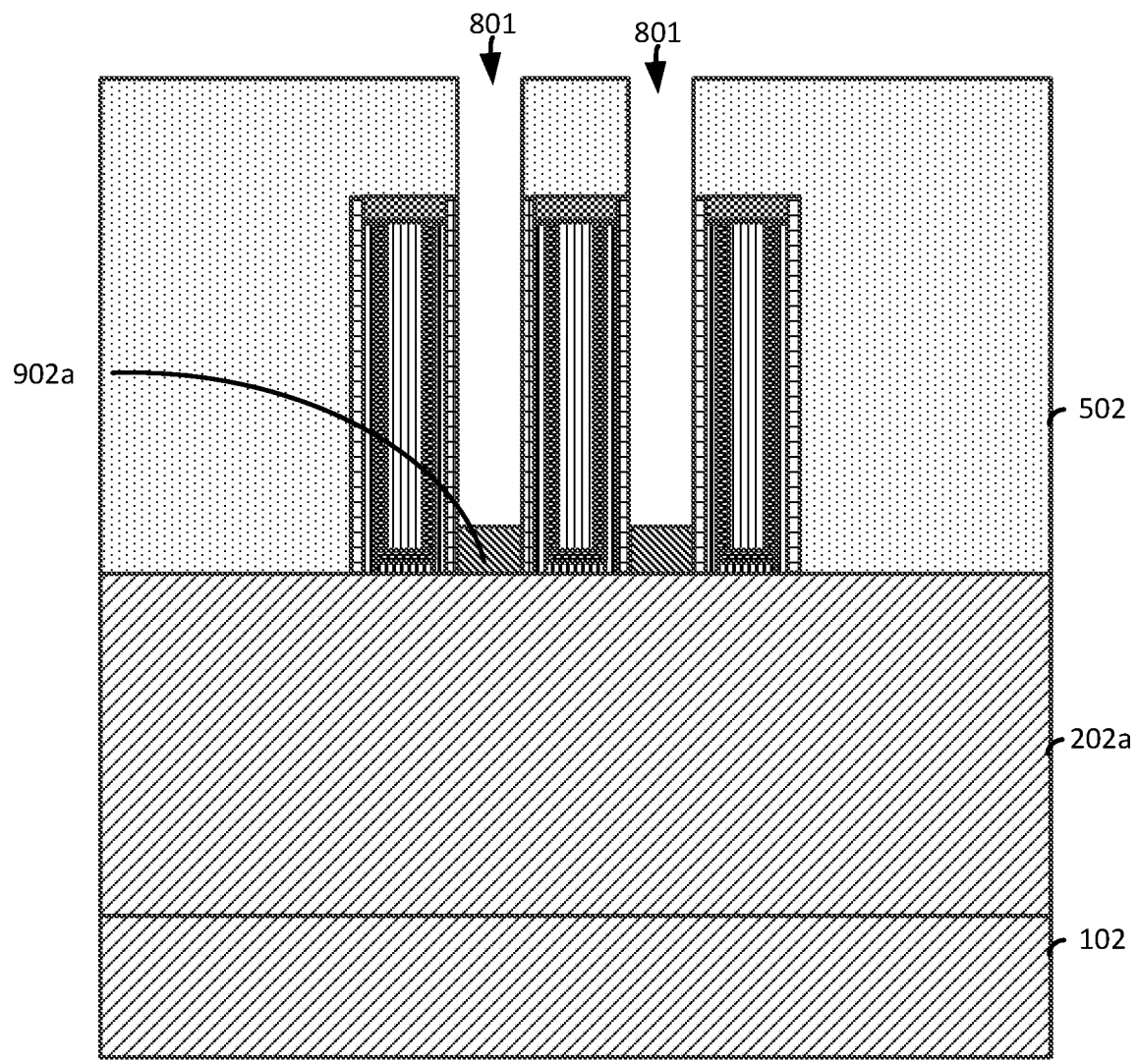
FIG. 9A illustrates a cut-away view along the fin following the formation of source/drain regions.

FIG. 9A illustrates a cut-away view along the fin 202a following the formation of source/drain regions 902a. The source/drain regions 902a are formed by an epitaxial growth process that deposits a crystalline overlayer of semiconductor material onto the exposed crystalline seed material of the exposed fin 202a to form the source/drain regions 902a. In the illustrated exemplary embodiment, the source/drain region 902a includes a doped SiGe material that can form a pFET device.

Figure 9B:
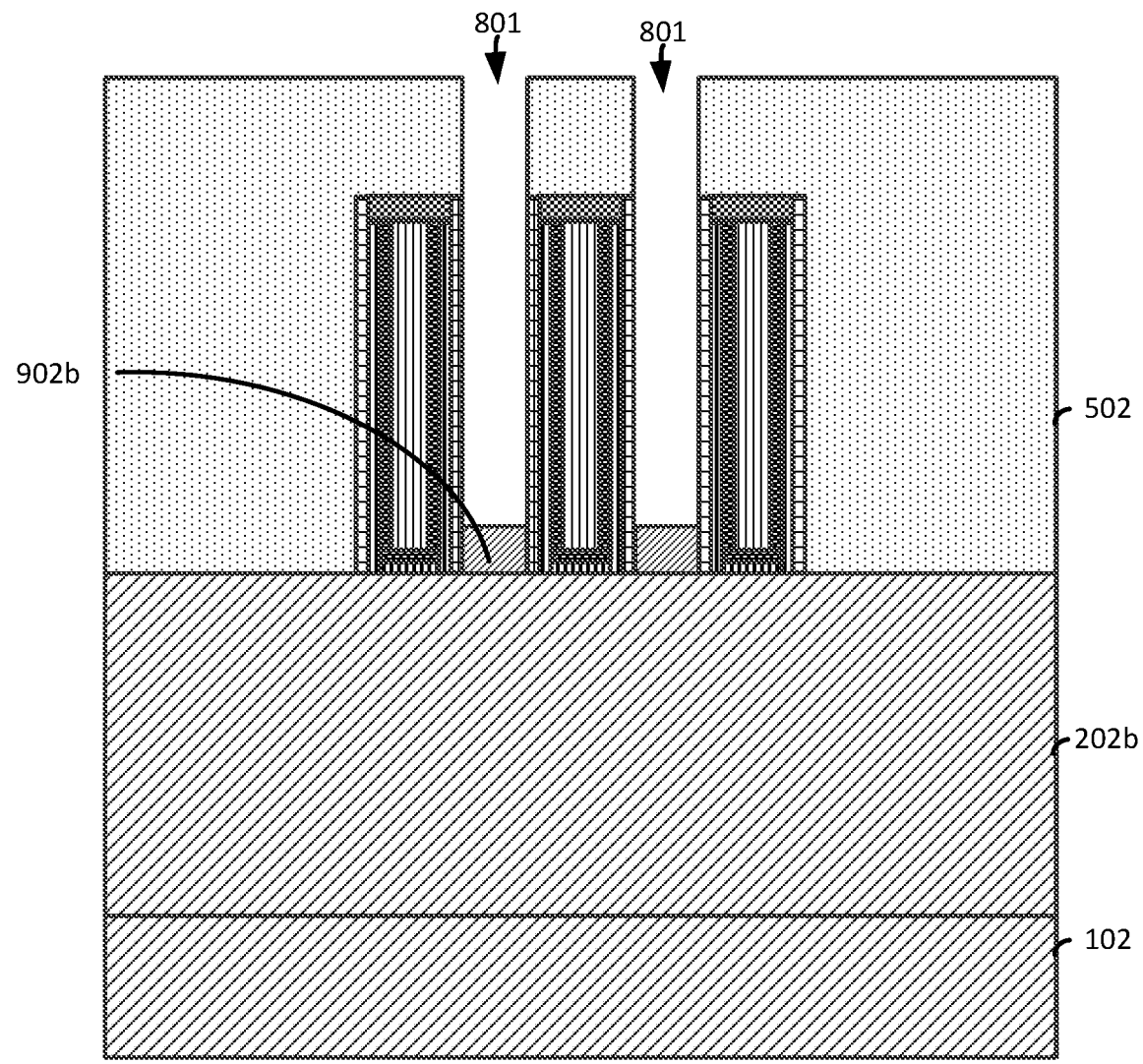
FIG. 9B illustrates a cut-away view along the fin following the formation of source/drain regions on the exposed fin.

FIG. 9B illustrates a cut-away view along the fin 202b following the formation of source/drain regions 902b on the exposed fin 202b. In the illustrated exemplary embodiment, the source/drain region 902b includes a doped Si material that can form an nFET device.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ and $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 10A:
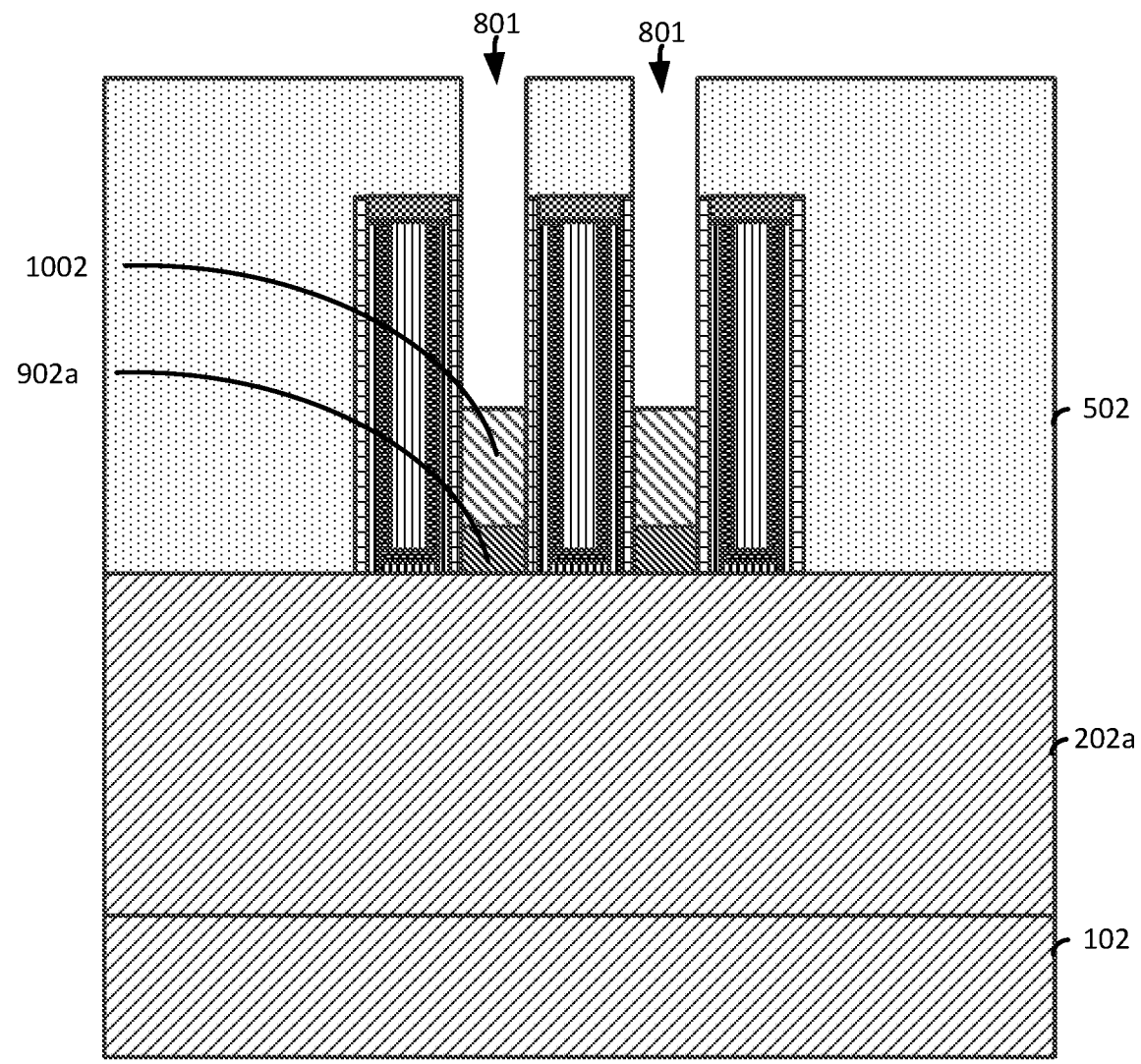
FIGS. 10A and 10B illustrate cut-away views following the formation of a trench layer.
Figure 10B:
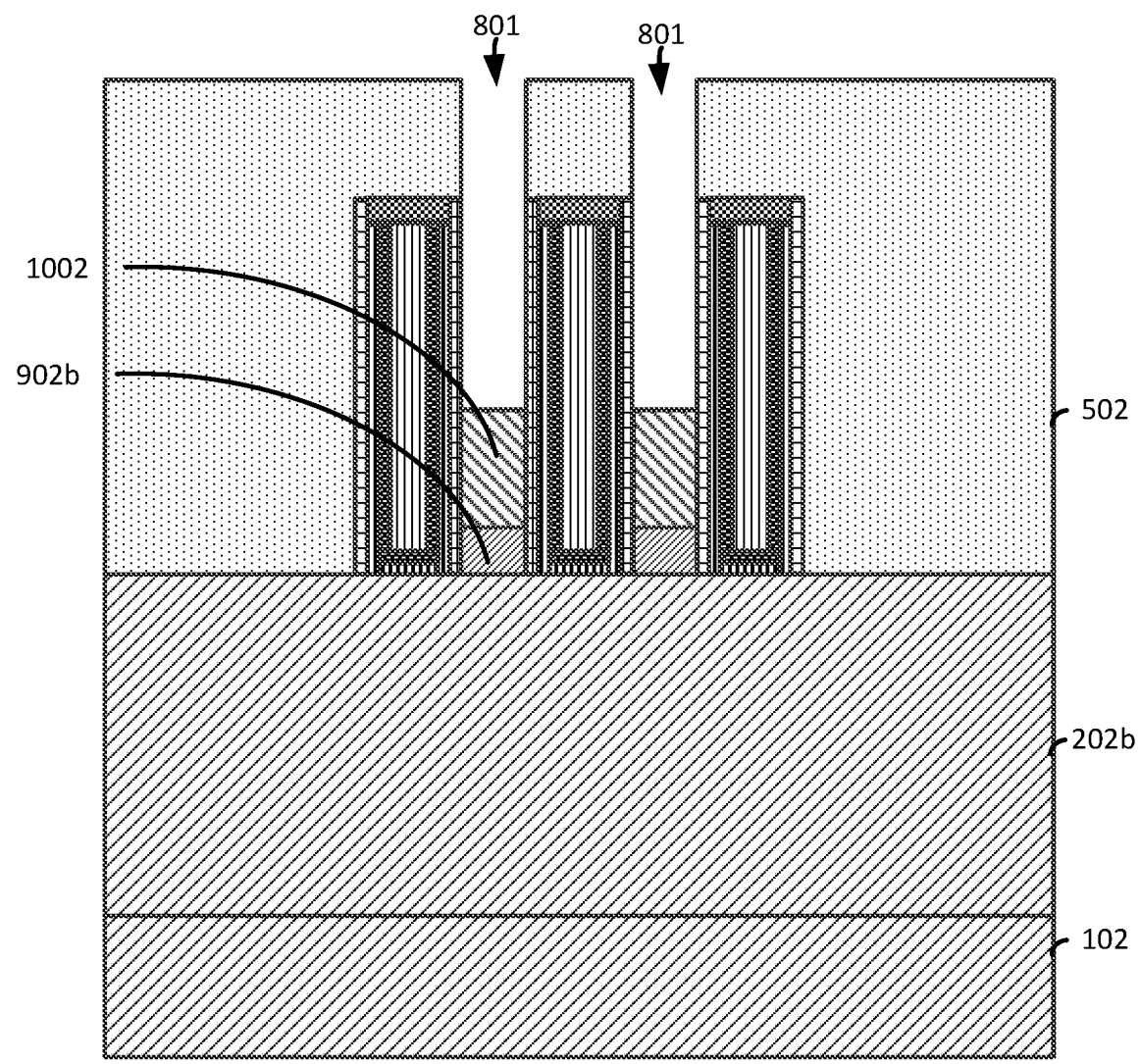

FIGS. 10A and 10B illustrate cut-away views following the formation of a trench layer 1002. The trench layer 1002 in the illustrated embodiment is formed in the cavity 802 using, for example, an epitaxial growth process that forms a layer of Ge over the source/drain regions 902a and 902b. In the illustrated exemplary embodiment, the trench layer 1002 includes a dopant such as, for example Boron. The thickness of the trench layer is approximately 2 nm to 40 nm.

Figure 11A:
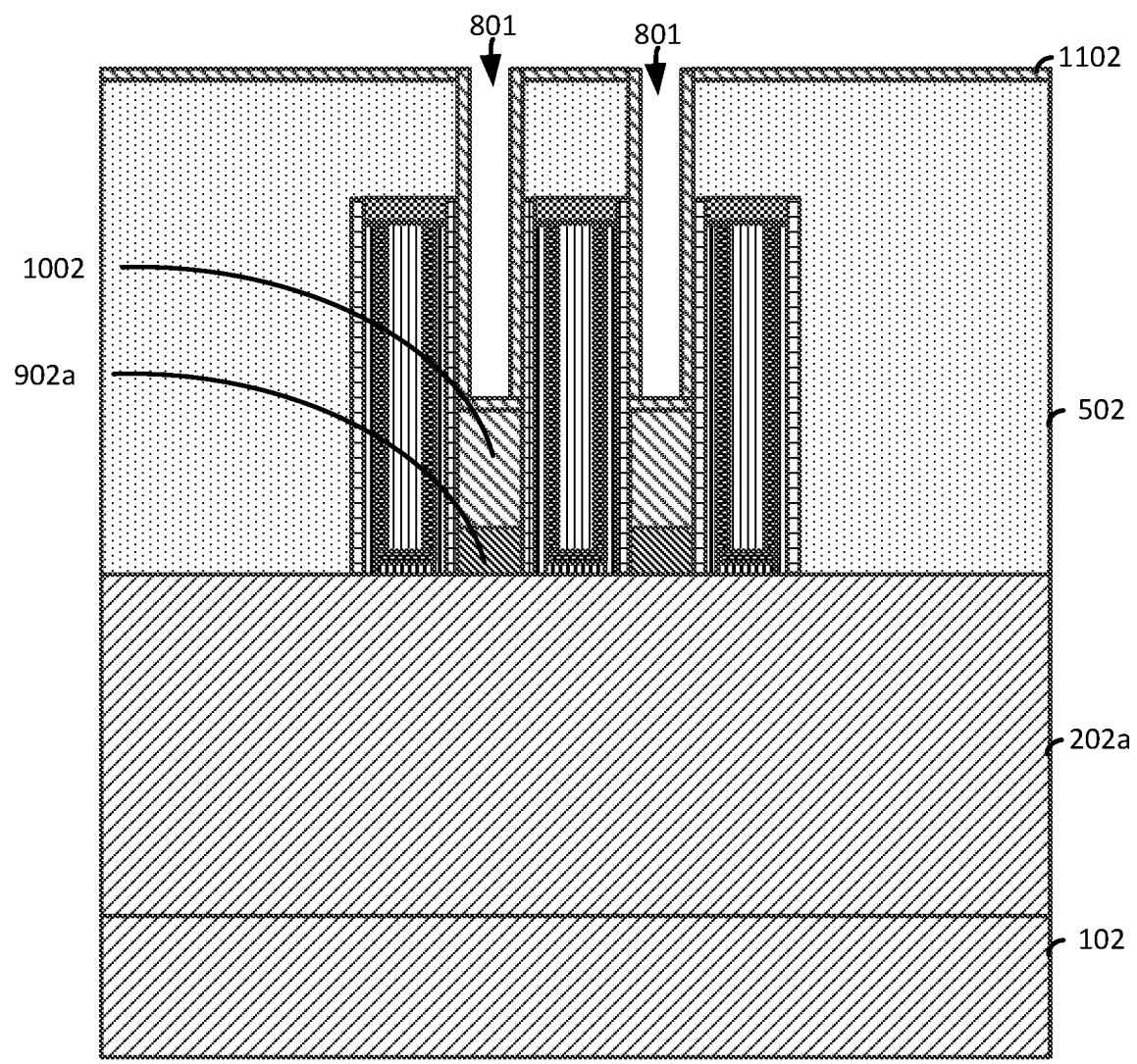
FIGS. 11A and 11B illustrate cut-away views following the deposition of a liner layer over exposed portions of the inter-level dielectric layer and over the trench layer in the cavities.
Figure 11B:
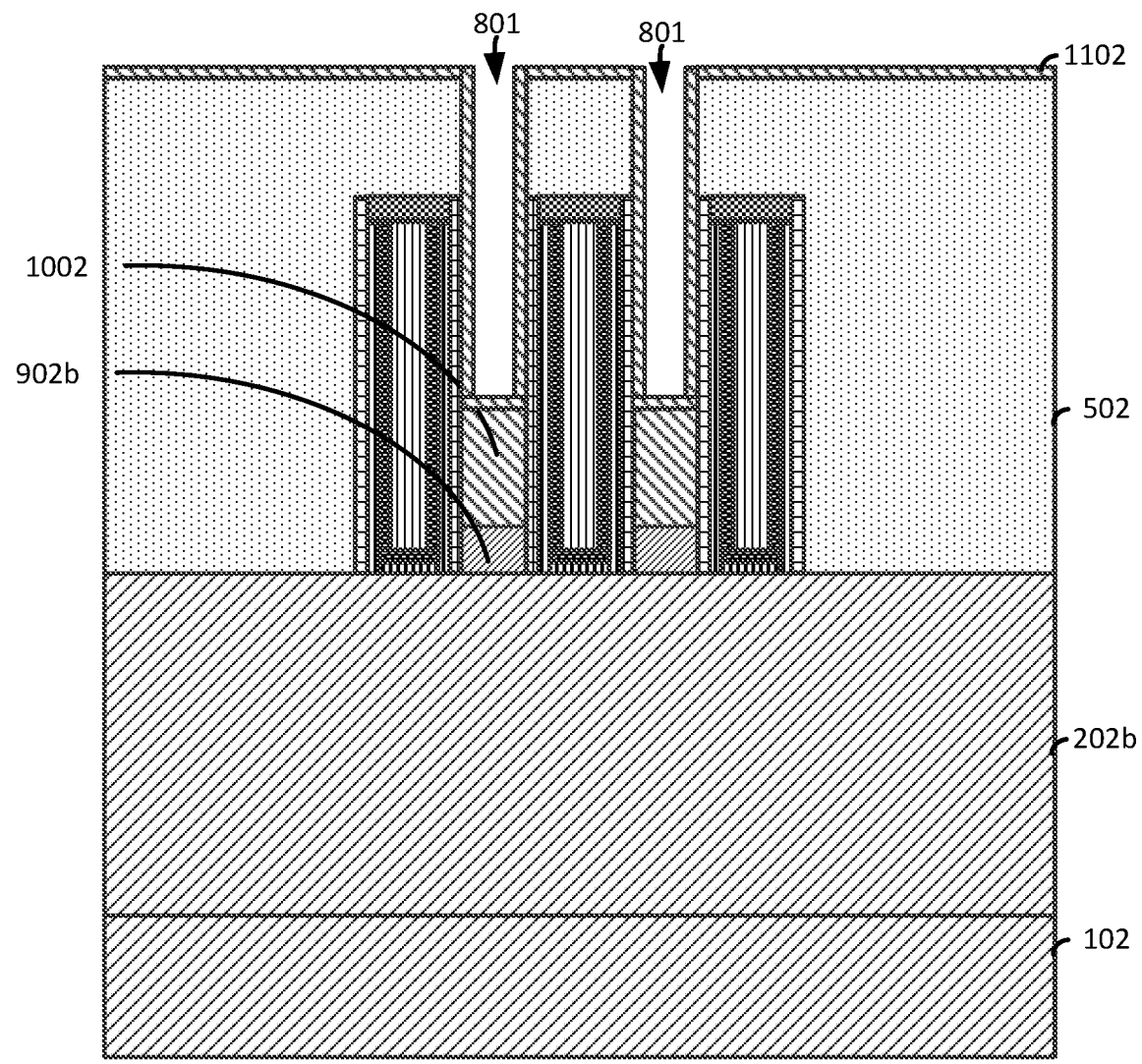

FIGS. 11A and 11B illustrate cut-away views following the deposition of a liner layer 1102 over exposed portions of the inter-level dielectric layer 502 and over the trench layer 1002 in the cavities 801. In the illustrated exemplary embodiment, the liner layer 1102 includes, for example, a conductive metal oxide material such as, for example, Indium Tin Oxide (ITO), Indium Oxide (In$_2$O$_3$), Gallium Oxide (Ga$_2$O$_3$), or Zinc Oxide (ZnO).

Figure 12A:
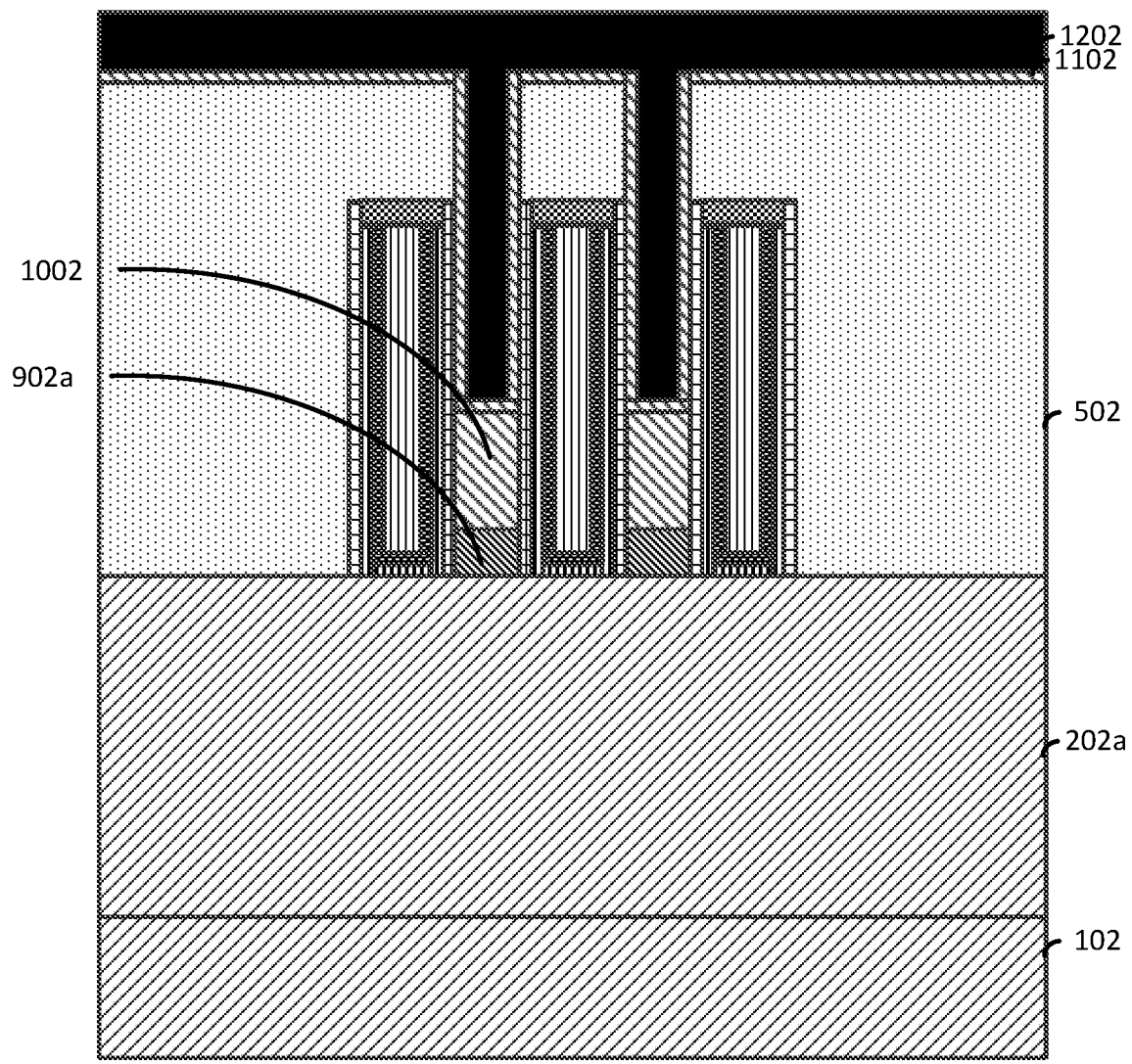
FIGS. 12A and 12B illustrate the resultant structure following the patterning of a mask over the liner layer on fin (in FIG. 12A).
Figure 12B:
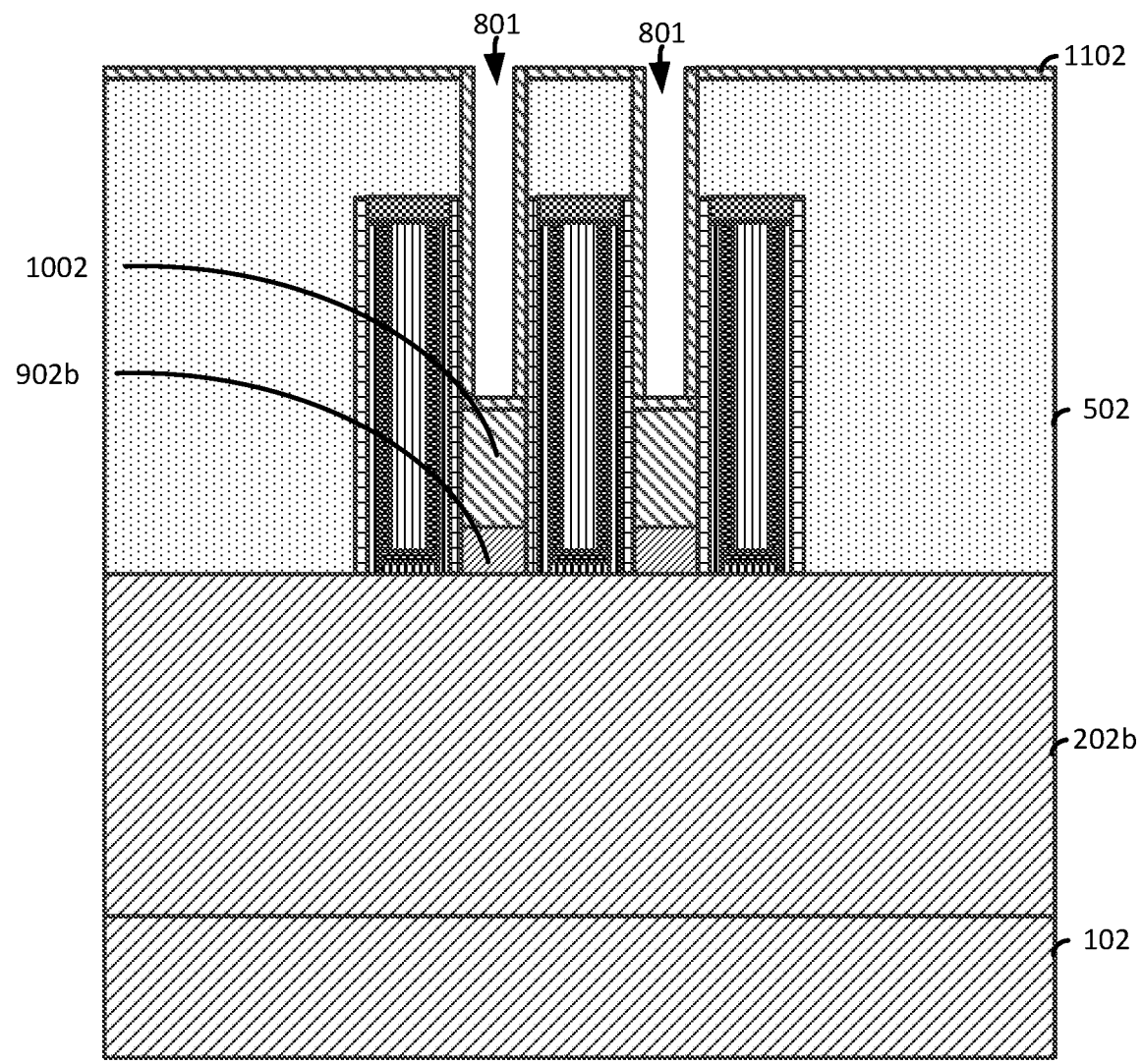

FIGS. 12A and 12B illustrate the resultant structure following the patterning of a mask 1202 over the liner layer 1102 on fin 202a (in FIG. 12A). Suitable resist masks include an optical planarization layer (OPL), photoresists, electron-beam resists, ion-beam resists, X-ray resists, and etch resists. The resist can a polymeric spin on material or a polymeric material.

Figure 13A:
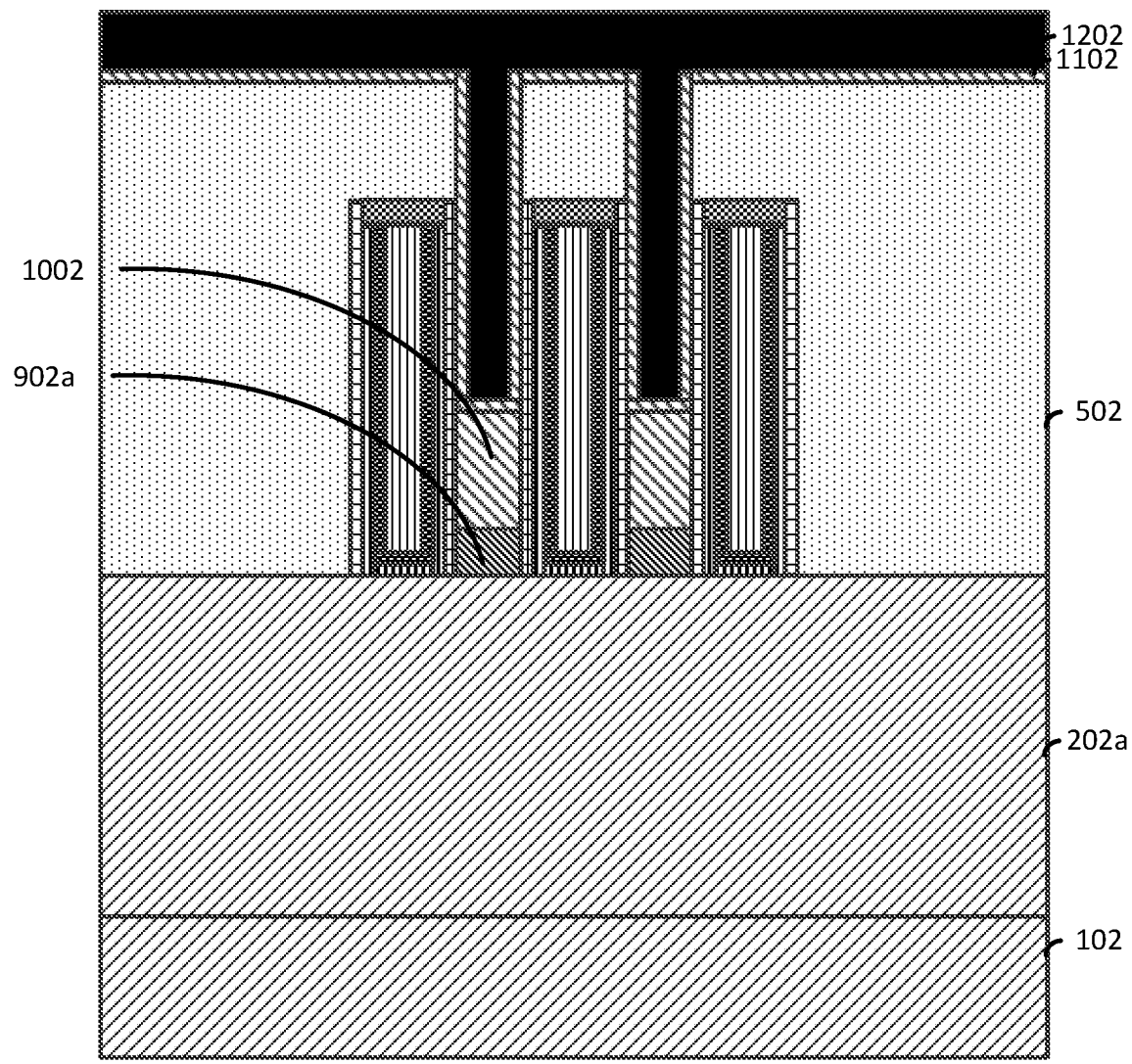
FIGS. 13A and 13B illustrate the resultant structure following a selective etching process that removes exposed portions of the liner layer and the trench layer (in FIG. 13B) to expose the source/drain region.
Figure 13B:
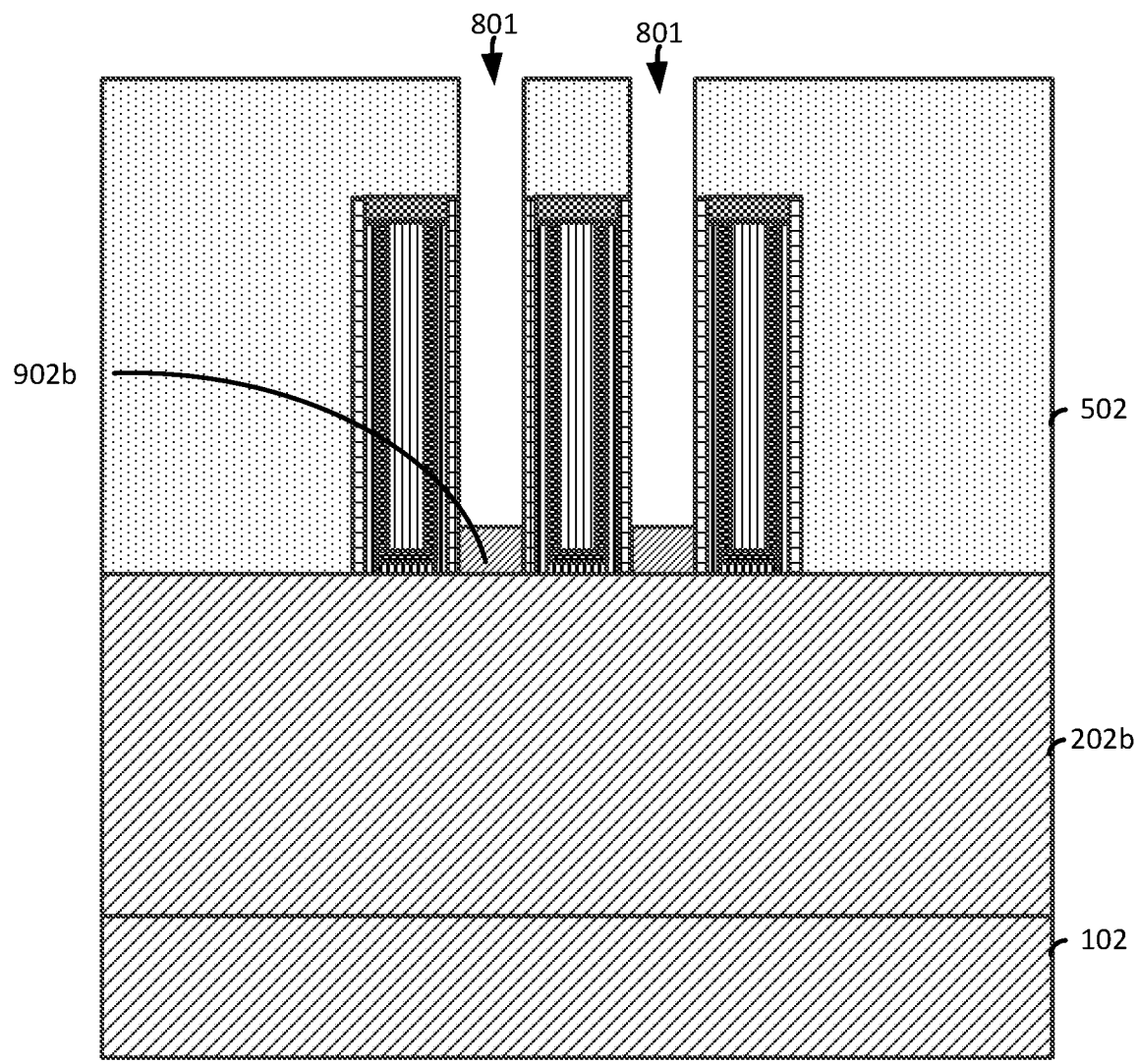

FIGS. 13A and 13B illustrate the resultant structure following a selective etching process that removes exposed portions of the liner layer 1102 and the trench layer 1002 (in FIG. 13B) to expose the source/drain region 902b. The selective etching process can include, for example, a HCl chemical or NH$_4$OH mixed with H$_2$O$_2$ chemical and/or dry etching process.

Following the removal of portions of the liner layer 1102, an ion implantation process can be performed to implant dopants in the source/drain region 902b.

Figure 14A:
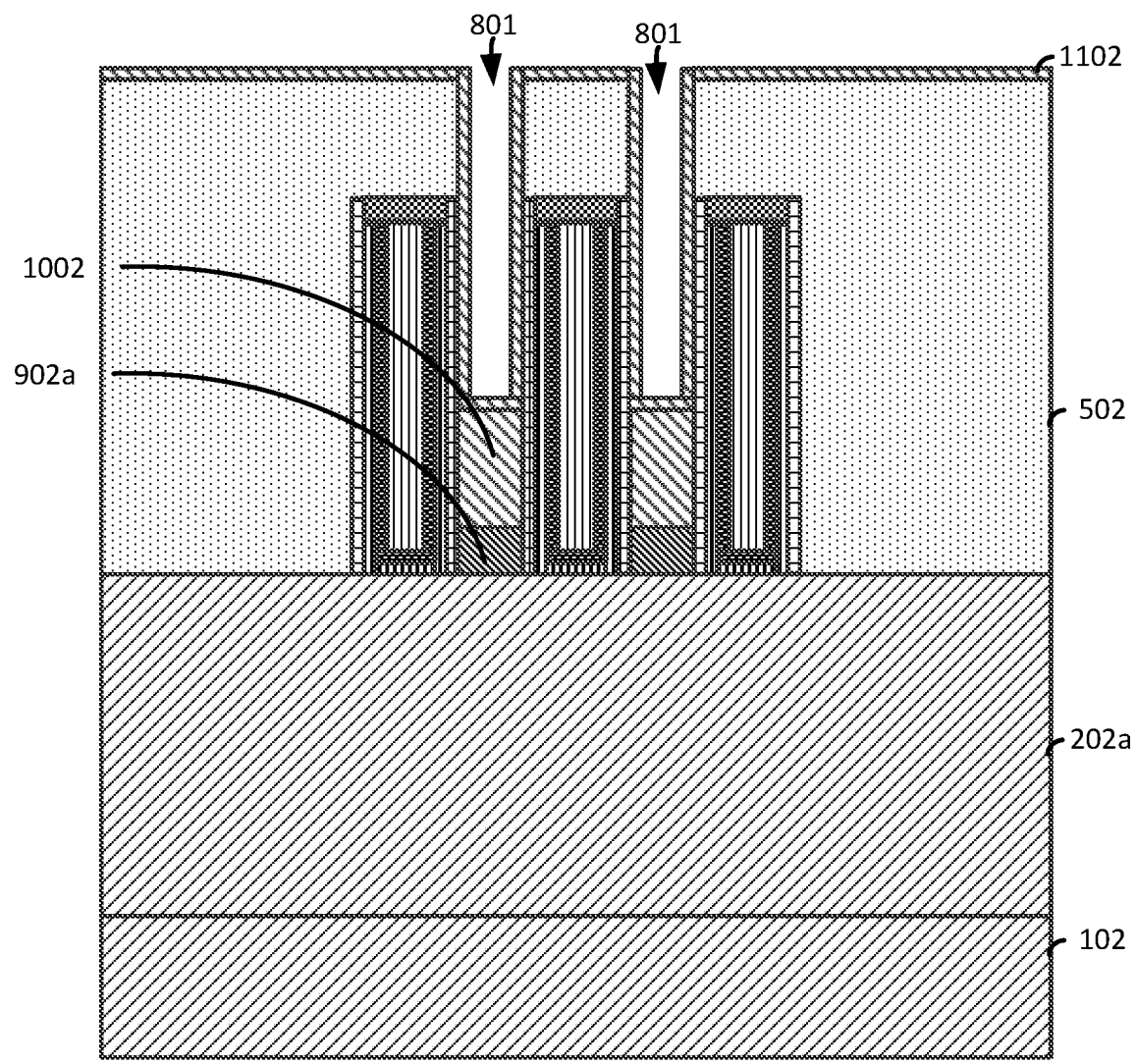
FIGS. 14A and 14B illustrate cut-away views of the resultant structure following the removal of the mask (of FIG. 13A) using a suitable mask removal process.
Figure 14B:
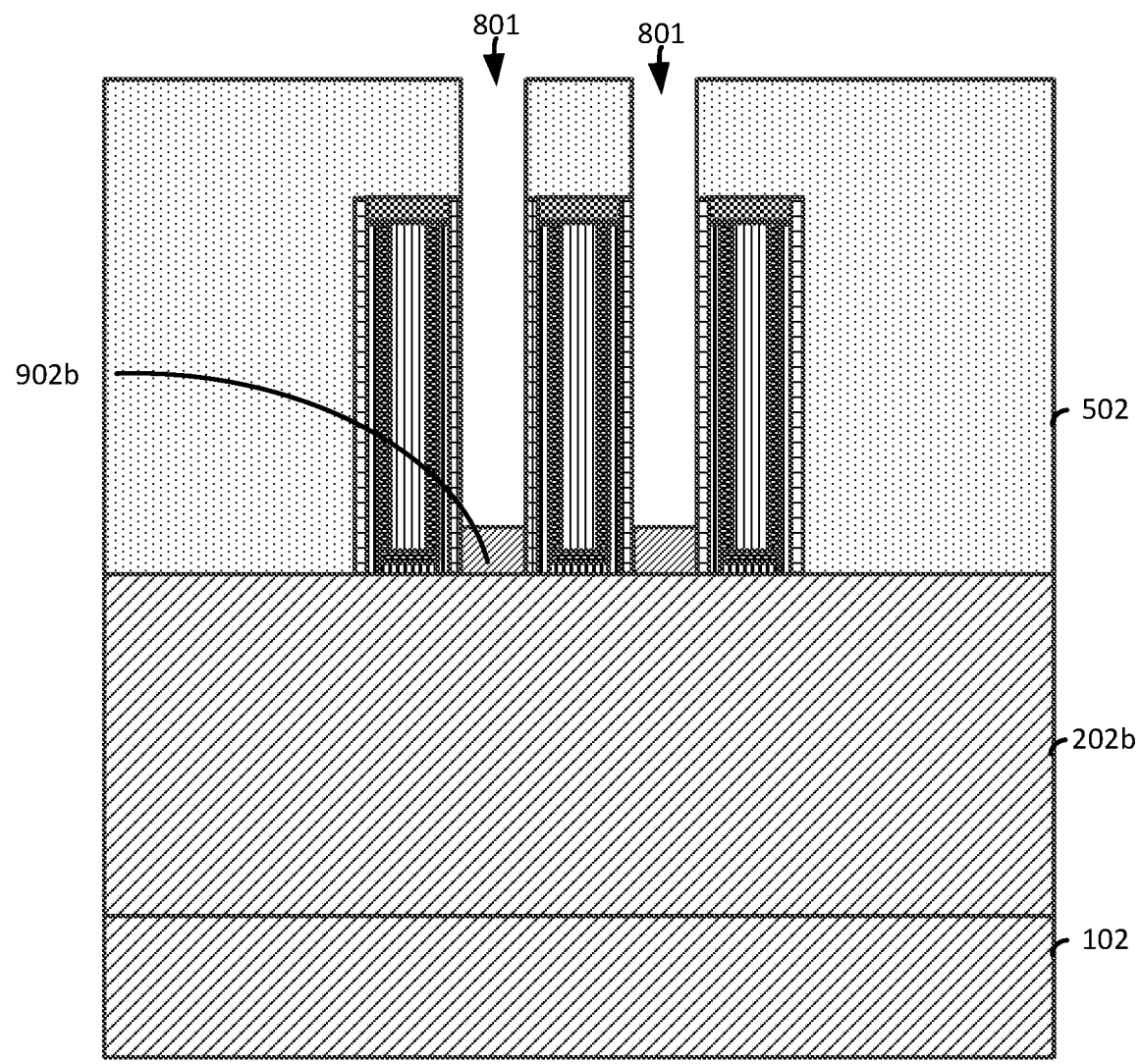

FIGS. 14A and 14B illustrate cut-away views of the resultant structure following the removal of the mask 1202 (of FIG. 13A) using a suitable mask removal process such as, for example, ashing. The ashing process can be used to remove a photoresist material, amorphous carbon, or organic planarization (OPL) layer. Ashing is performed using a suitable reaction gas, for example, O$_2$, N$_2$, H2/N2, O$_3$, CF$_4$, or any combination thereof.

Following the removal of the mask 1202, an annealing process such as, for example, a solid or liquid phase epitaxial annealing process can be performed.

Figure 15A:
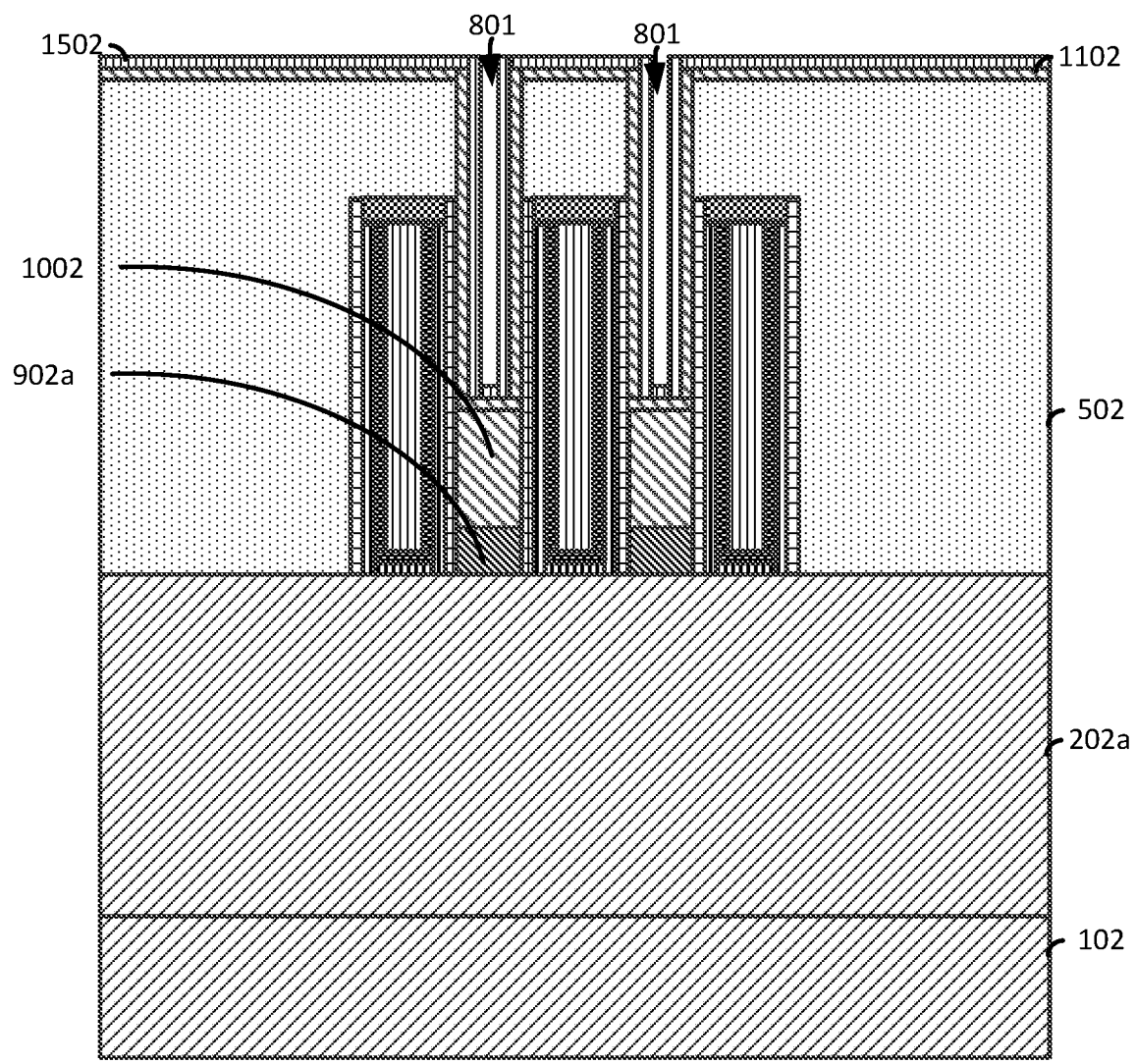
FIGS. 15A and 15B illustrate a cut-away view following the deposition of a second liner layer over the liner layer (in FIG. 15A) and over the source/drain regions (in FIG. 15B).
Figure 15B:
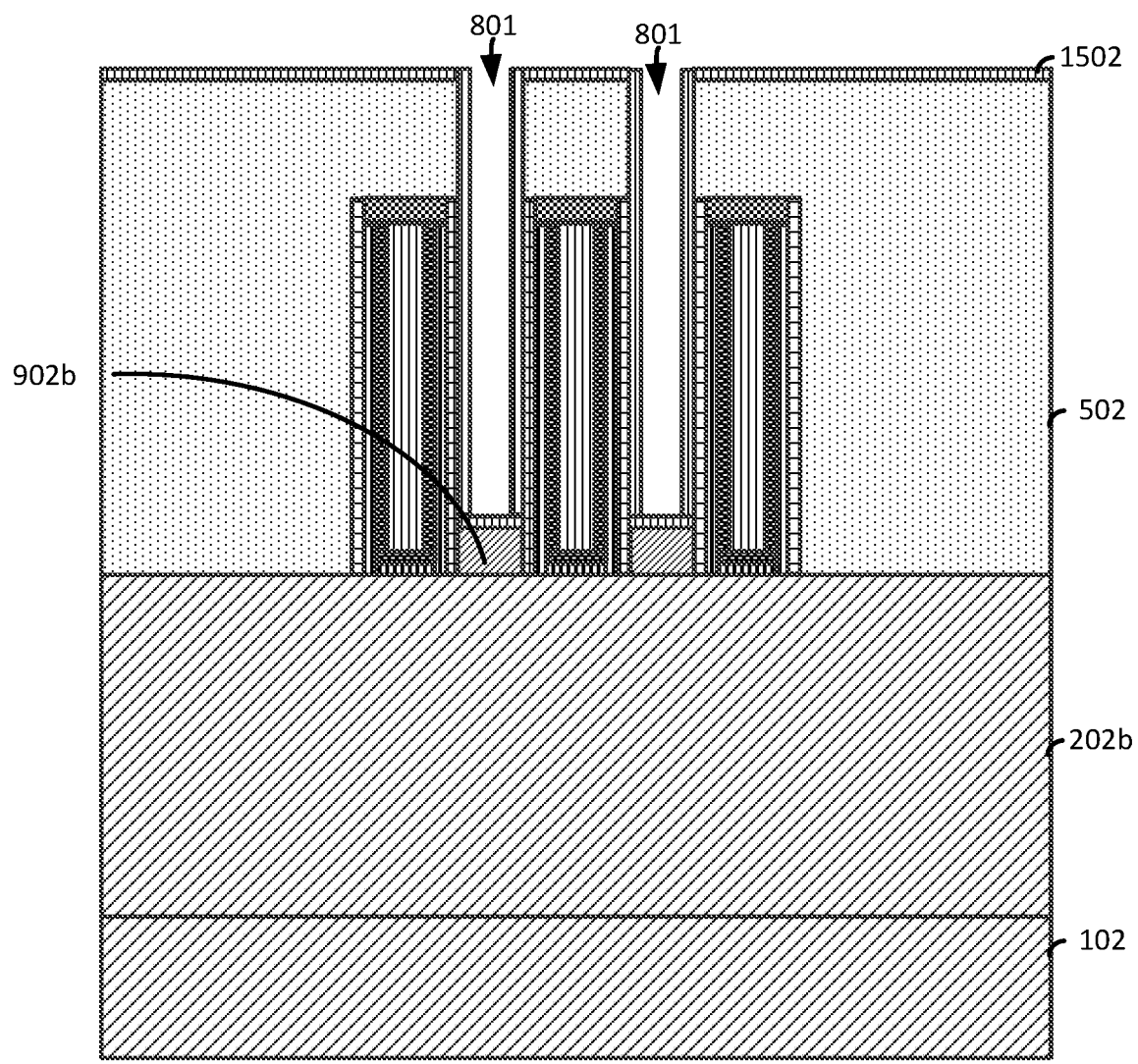

FIGS. 15A and 15B illustrate a cut-away view following the deposition of a second liner layer 1502 over the liner layer 1102 (in FIG. 15A) and over the source/drain regions 902b (in FIG. 15B). The second liner layer 1502 includes a liner material such as, for example, Ti or TiN that can be deposited using any suitable deposition process such as, for example, plasma vapor deposition or atomic layer deposition.

Where the second liner layer 1502 is deposited over the liner layer 1102, the second liner layer 1502 scavenges residual carbon and/or oxide or metal oxide from the liner layer 1102.

Figure 16A:
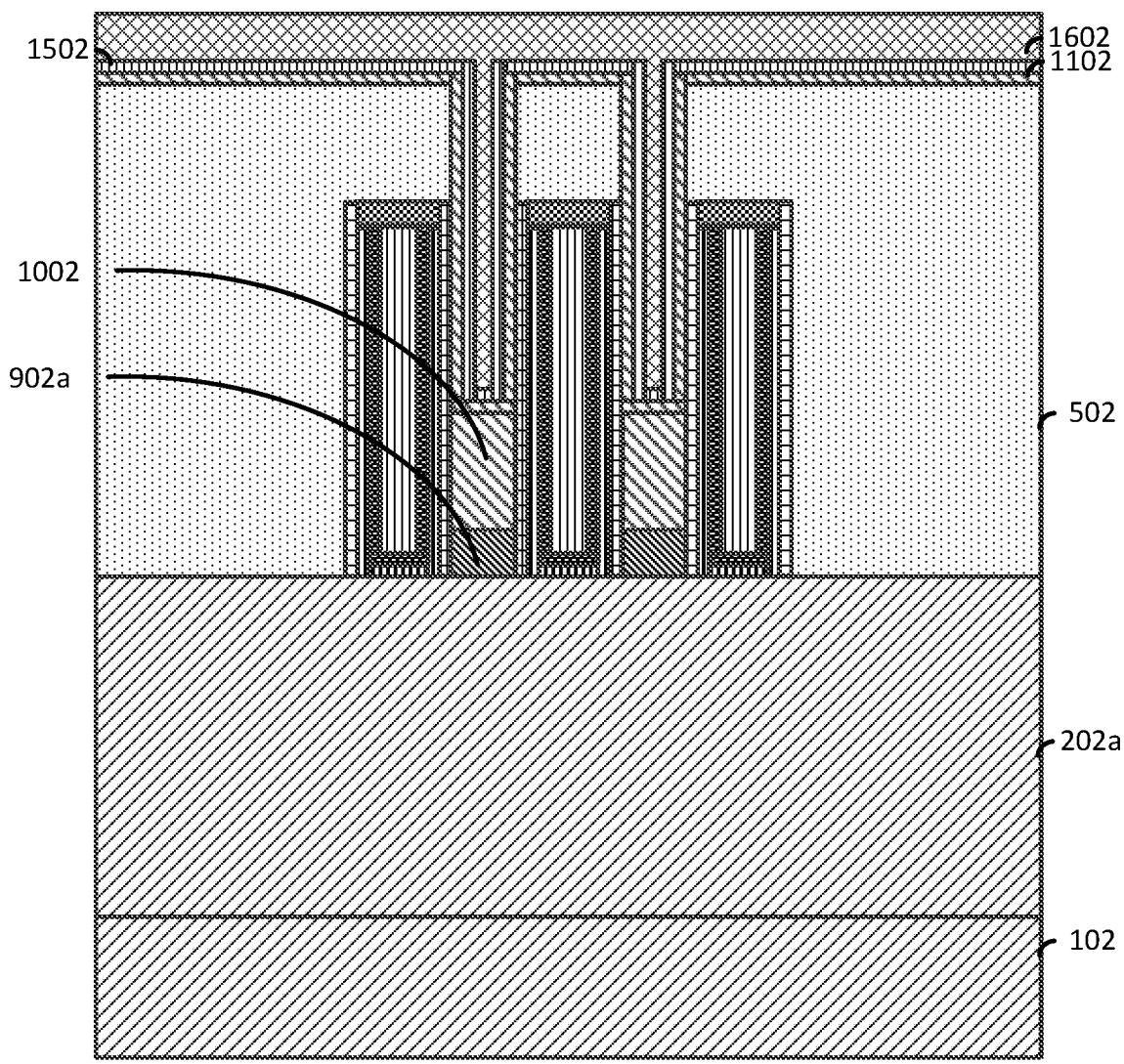
FIGS. 16A and 16B illustrate cut-away views of the resultant structure following the deposition of a conductive contact material over the second liner layer.
Figure 16B:
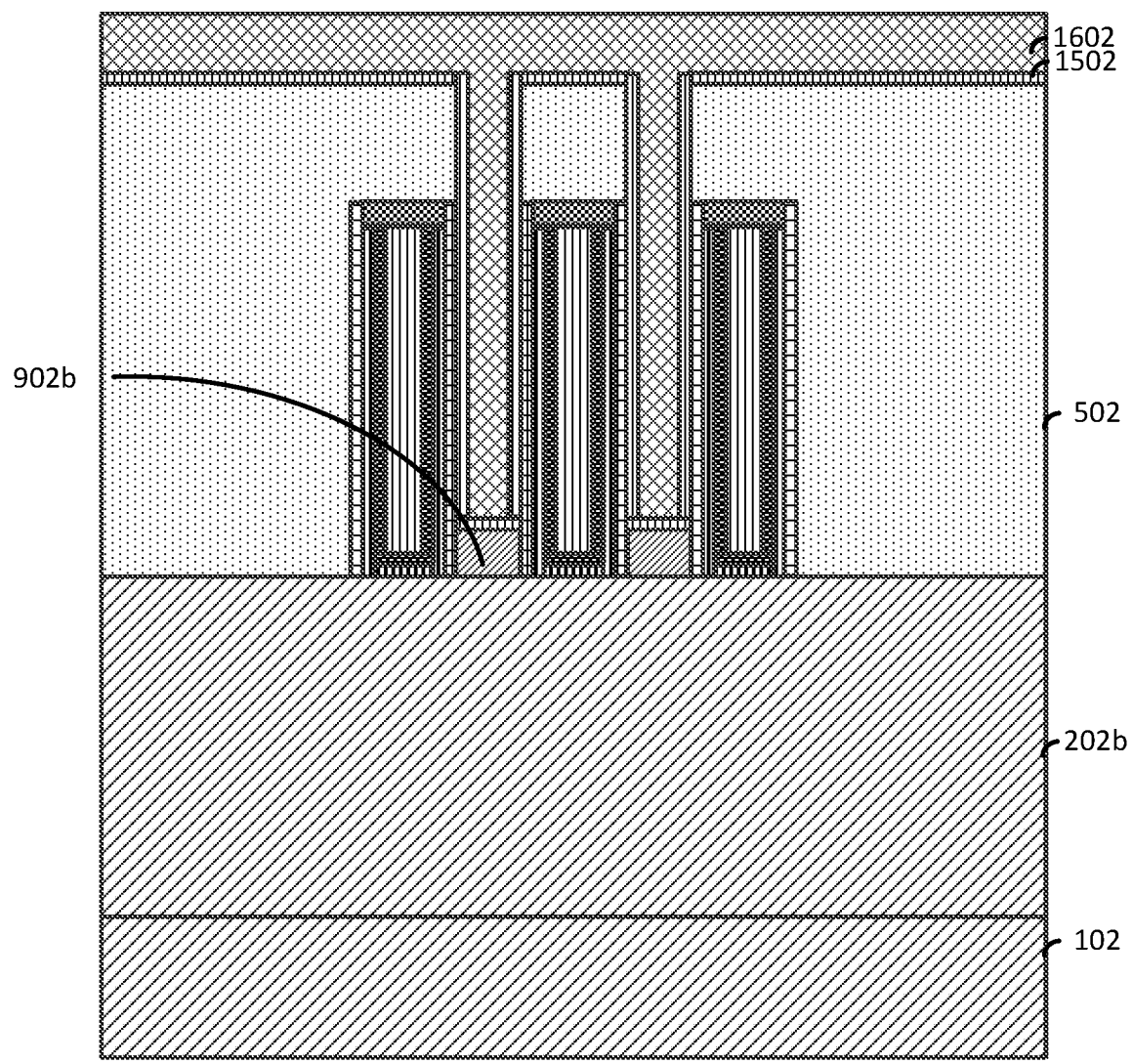

FIGS. 16A and 16B illustrate cut-away views of the resultant structure following the deposition of a conductive contact material 1602 over the second liner layer 1502. The conductive contact material 1602 is deposited in the cavities 801 (of FIGS. 15A and 15B). The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

Figure 17A:
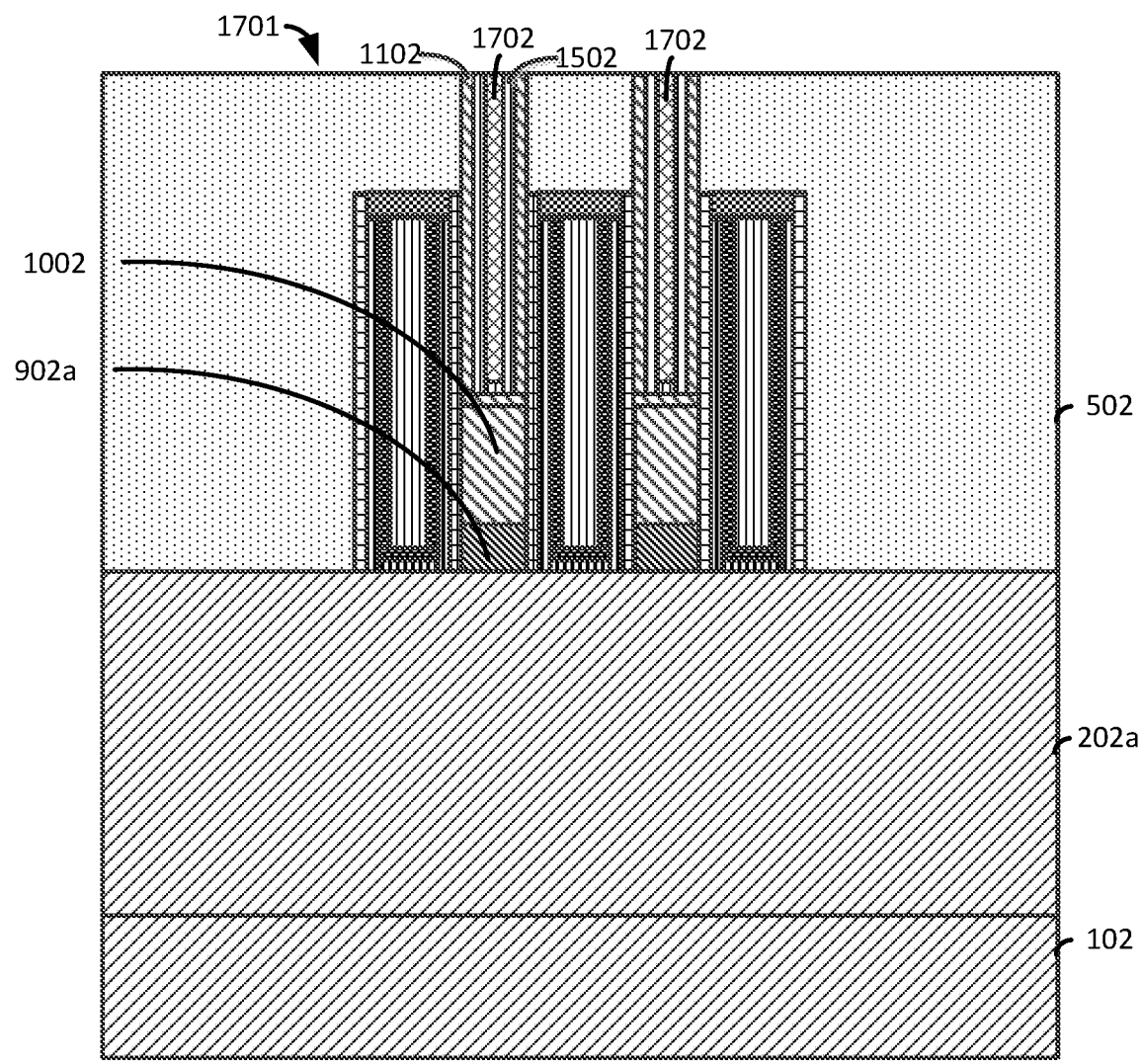
Figure 17B:
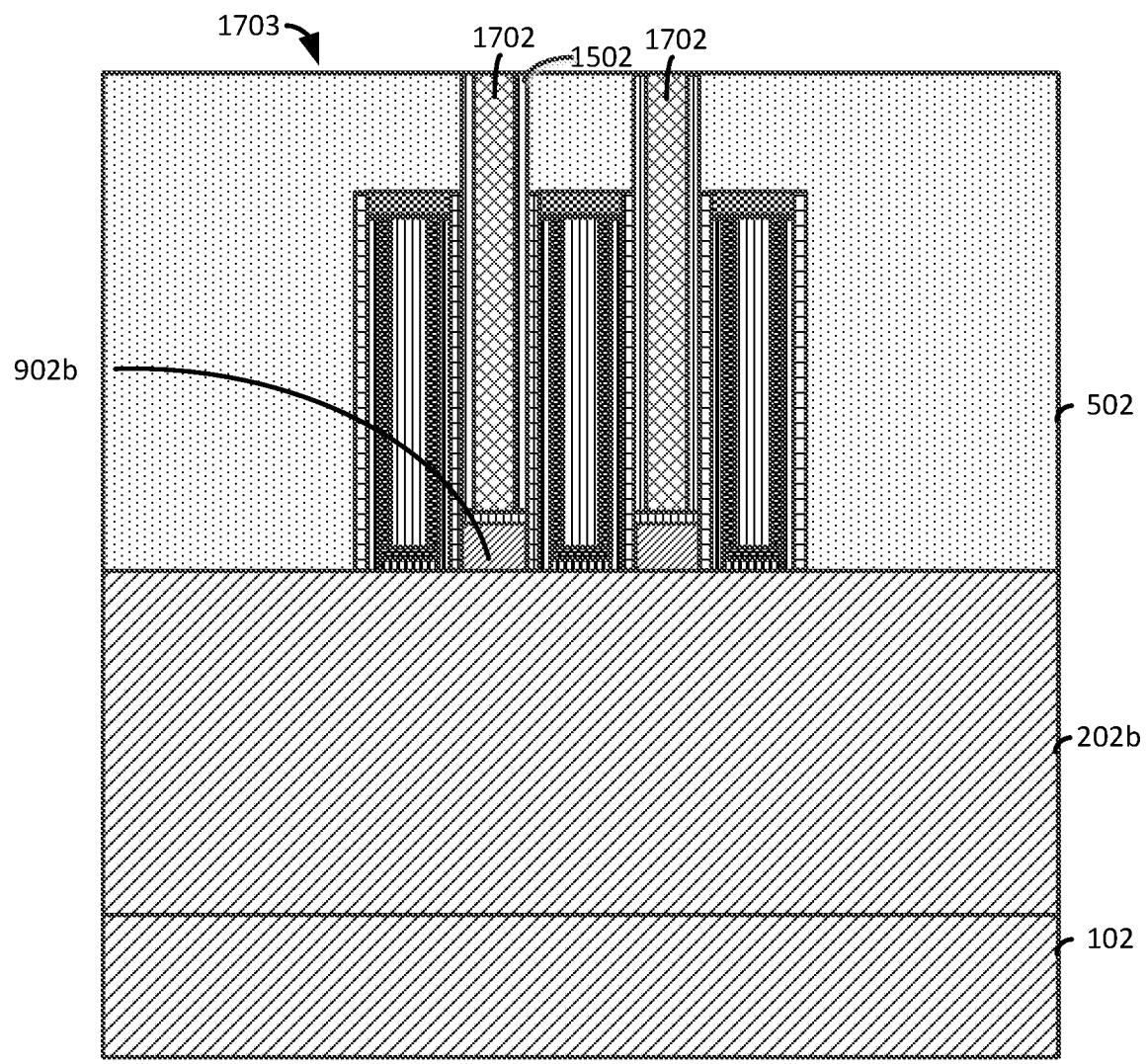

FIGS. 17A and 17B illustrate cut-away views following a planarization process that removes overburdened materials and forms conductive contacts 1702 of a pFET device 1701 and an nFET device 1703. The planarization process can include for example, a chemical mechanical polishing process.

The resultant structure of FIGS. 17A and 17B includes a pFET device 1701 that has a source/drain region 902a that includes a doped SiGe material (e.g., SiGe:B) arranged on the fin 202a, a trench layer 1002 on the source/drain region 902a that includes a doped crystalline material such as, for example, (Ge:B). A liner layer 1502 that includes a conductive metal oxide material is arranged on the trench layer 1002, and a conductive metallic contact 1702 is arranged on the liner layer 1502.

The resultant structure of FIGS. 17A and 17B also includes an nFET device 1703 that has a source/drain region 902b that includes a doped Si material (e.g., Si:P) arranged on the fin 202b. A liner layer 1502 that includes a metal oxide material is arranged on the source/drain region 902b, and a conductive metallic contact 1702 is arranged on the liner layer 1502.

Such an arrangement reduces the contact resistance in the pFET device 1701 while forming both the nFET device 1703 and the pFET device 1703.

The exemplary method described in FIGS. 1-17B illustrate forming the replacement metal gate stack prior to forming the conductive contacts. The exemplary method described below in FIGS. 18-20 illustrate forming the replacement metal gate stack after forming the conductive contacts.

Figure 18:
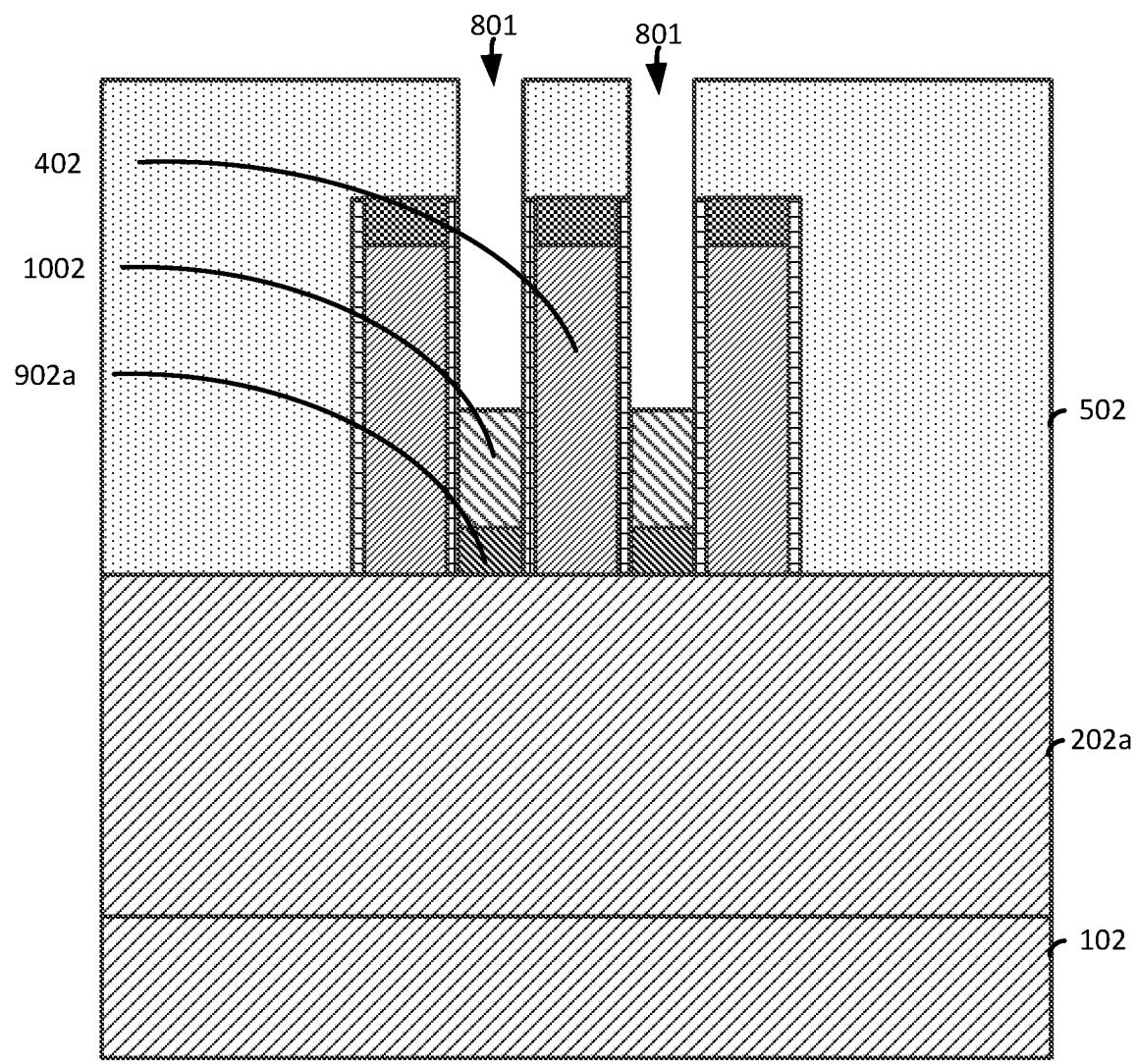
FIG. 18 is similar to FIG. 10A described above however, the trenches, the source/drain regions and the trench layer are formed in a similar manner as described above prior to removing the sacrificial gates.

FIG. 18 is similar to FIG. 10A described above however, the trenches 801, the source/drain regions 902a and the trench layer 1002 are formed in a similar manner as described above prior to removing the sacrificial gates 402.

Figure 19:
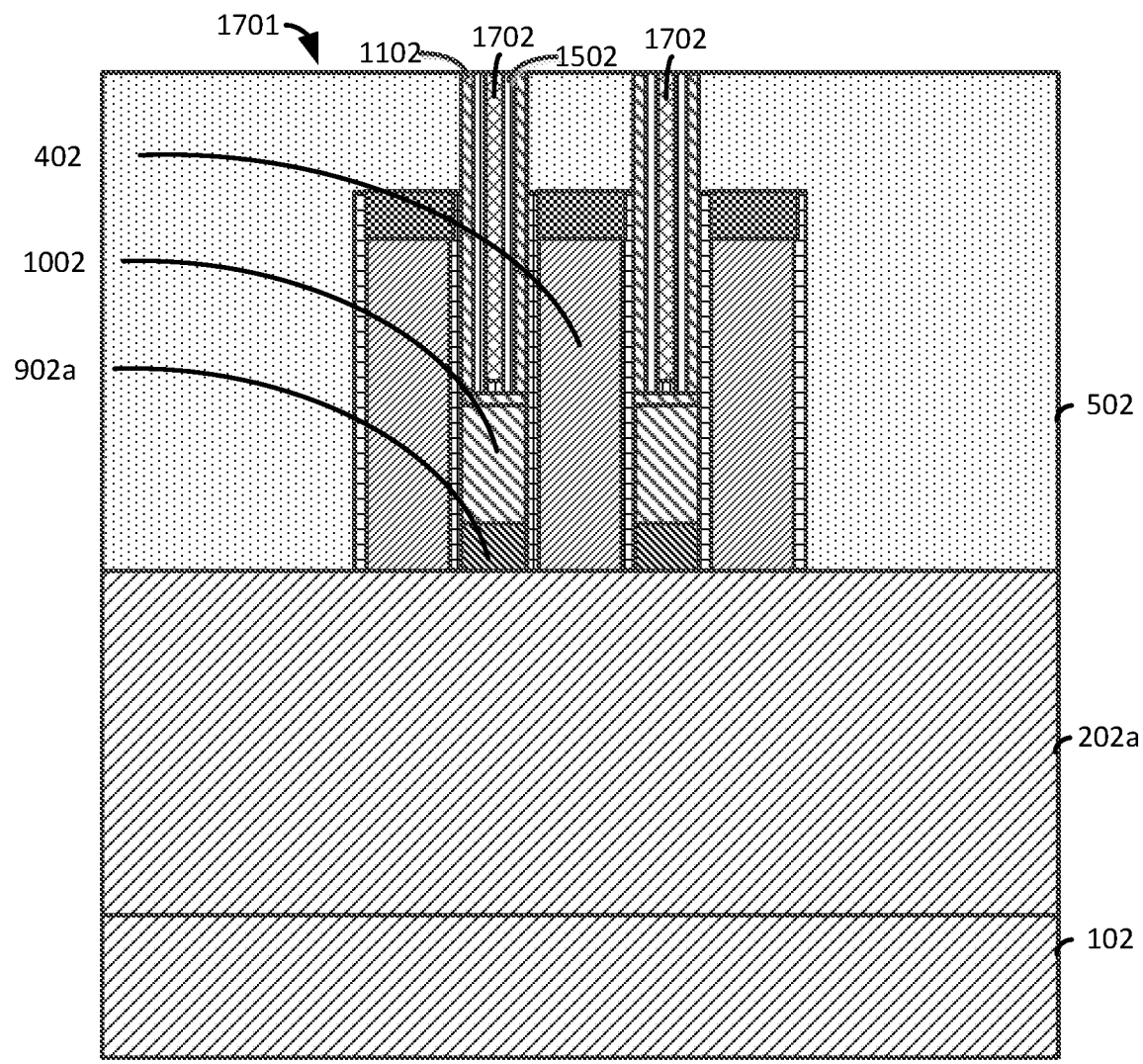
FIG. 19 is similar to FIG. 17A described above however, the conductive contacts have been formed in a similar manner as described above prior to removing the sacrificial gates.

FIG. 19 is similar to FIG. 17A described above however, the conductive contacts 1702 have been formed in a similar manner as described above prior to removing the sacrificial gates 402.

Figure 20:
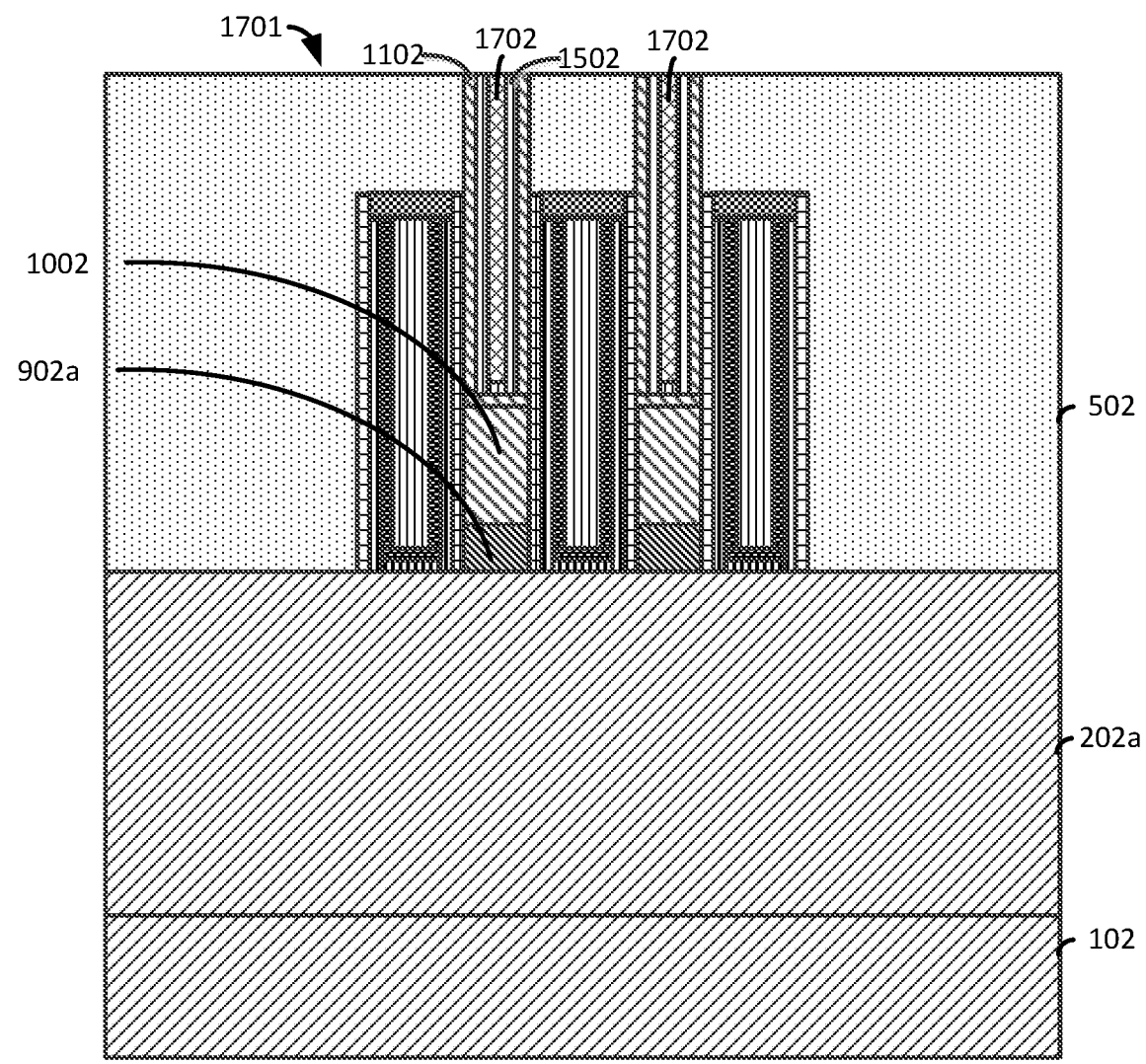
FIG. 20 is similar to FIG. 17A described above however, following the formation of the conductive contacts, the sacrificial gates have been removed and gate stacks have been formed in a similar manner as described above in FIGS. 6-7.

FIG. 20 is similar to FIG. 17A described above however, following the formation of the conductive contacts 1702, the sacrificial gates 402 have been removed and gate stacks 701 have been formed in a similar manner as described above in FIGS. 6-7.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating a semiconductor device of a PFET and an NFET, the method comprising:
    forming a gate stack on a semiconductor substrate;
    forming a first source/drain region in the PFET and a second source/drain region in the NFET on an exposed portion of the substrate;
    forming a first semiconductor material layer on the first source/drain region in first trenches and a second semiconductor material layer on the second source/drain region in second trenches, wherein the first and second semiconductor material layers are formed by epitaxial growth;
    depositing a first liner layer only on the first semiconductor material layer;
    depositing a second liner layer on the first liner layer in the PFET and on the, second semiconductor material layer in the NFET: and
    depositing a conductive contact material on the second liner layer in the PFET and on the second liner layer in the NFET.

2. The method of claim 1, wherein the first semiconductor material layer includes crystalline Ge.

3. The method of claim 1, wherein the first source/drain region includes doped SiGe material.

4. The method of claim 1, wherein the first liner layer includes a conductive metallic oxide material.

5. The method of claim 1, wherein the second liner layer includes a metallic material.

6. The method of claim 1, wherein the second liner layer includes Ti.

7. The method of claim 1, wherein the semiconductor substrate includes a semiconductor fin.

8. The method of claim 1, further comprising forming a spacer adjacent to the gate stack prior to forming the first source/drain region.

9. The method of claim 1, further comprising forming an insulator layer over portions of the substrate and adjacent to the gate stack prior to forming the source/drain region.

10. The method of claim 1, further comprising performing a planarization process after depositing the conductive contact material.

11. A method for fabricating a semiconductor device of a PFET and an NFET, the method comprising:
    forming a gate stack on a semiconductor substrate;
    forming a first source/drain region in the PFET and a second source/drain region in the NFET on an exposed portion of the substrate, the first source/drain region including a first dopant;
    forming a first semiconductor material layer on the first source/drain region in first trenches and a second semiconductor material layer on the second source/drain region in second trenches, wherein the first and second semiconductor material layers are formed by epitaxial growth;
    depositing a first liner layer including a conductive metallic oxide material only on the first semiconductor material layer;
    depositing a second liner layer including a metallic material on the first liner layer in the PFET and on the second semiconductor material layer in the NFET; and
    depositing a conductive contact material on the second liner layer in the PFET and on the, second liner layer in the NFET.

12. The method of claim 11, wherein the first semiconductor material layer includes crystalline Ge.

13. The method of claim 11, wherein the first source/drain region includes doped SiGe material.

14. The method of claim 11, wherein the second liner layer includes Ti.

15. The method of claim 11, further comprising forming a spacer adjacent to the gate stack prior to forming the source/drain region.

16. The method of claim 11, further comprising forming an insulator layer over portions of the substrate and adjacent to the gate stack prior to forming the source/drain region.

17. The method of claim 11, further comprising performing a planarization process after depositing the conductive contact material.

18. A method for fabricating a semiconductor device, the method comprising:
    forming a gate stack on a semiconductor substrate;
    forming a first source/drain region and a second source/drain region on exposed portions of the substrate;
    forming a semiconductor material layer on the first source/drain region and the second source/drain region;
    depositing a first liner layer on the semiconductor material layer over the first source/drain region and the second source/drain region;
    removing a portion of the first liner layer from over the second source/drain region;
    removing a portion of the semiconductor material layer to expose the second source/drain region;
    depositing a second liner layer on the first liner layer and the exposed second source/drain region; and
    depositing a conductive contact material on the second liner layer.

19. The method of claim 18, wherein the first liner layer includes a conductive metallic oxide material, and the second liner layer includes Ti.

* * * * *